(12) United States Patent
Kodama et al.

(10) Patent No.: US 11,770,132 B2
(45) Date of Patent: Sep. 26, 2023

(54) COMPRESSION DEVICE AND CONTROL METHOD

(71) Applicant: Kioxia Corporation, Tokyo (JP)

(72) Inventors: Sho Kodama, Kawasaki (JP); Masato Sumiyoshi, Yokohama (JP); Keiri Nakanishi, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 277 days.

(21) Appl. No.: 17/304,130

(22) Filed: Jun. 15, 2021

(65) Prior Publication Data

US 2022/0294469 A1 Sep. 15, 2022

(30) Foreign Application Priority Data

Mar. 11, 2021 (JP) ................................ 2021-039512

(51) Int. Cl.
*H03M 7/00* (2006.01)
*H03M 7/40* (2006.01)
*G06F 3/06* (2006.01)

(52) U.S. Cl.
CPC ........ *H03M 7/4093* (2013.01); *G06F 3/0608* (2013.01); *G06F 3/0659* (2013.01); *G06F 3/0679* (2013.01); *G06F 3/0655* (2013.01)

(58) Field of Classification Search
CPC .. H03M 7/4093; G06F 3/0659; G06F 3/0608; G06F 3/0655; G06F 3/0679
See application file for complete search history.

(56) References Cited

U.S. PATENT DOCUMENTS

| 4,122,440 | A | 10/1978 | Langdon, Jr. et al. |
| 9,337,862 | B2 | 5/2016 | Wu et al. |
| 10,694,217 | B2 | 6/2020 | Satpathy et al. |
| 2004/0017855 | A1* | 1/2004 | Otsuka ................. H04N 19/436 375/253 |
| 2020/0099958 | A1 | 3/2020 | Satpathy et al. |

FOREIGN PATENT DOCUMENTS

JP 6437575 B2 12/2018

* cited by examiner

*Primary Examiner* — Joseph J Lauture
(74) *Attorney, Agent, or Firm* — Oblon, McClelland, Maier & Neustadt, L.L.P.

(57) ABSTRACT

According to one embodiment, a compression device includes a coding information generation unit. The unit determines code lengths that are respectively associated with a plurality of symbols, based on a frequency of occurrence of each of the plurality of symbols. When the plurality of symbols include one or more first symbols that are respectively associated with one or more first code lengths exceeding an upper limit, the unit changes the first code lengths to the upper limit, selects, from one or more second symbols of the plurality of symbols that are respectively associated with one or more second code lengths shorter than the upper limit, at least one symbol in descending associated code length order, changes at least one code length associated with the symbol to the upper limit.

12 Claims, 16 Drawing Sheets

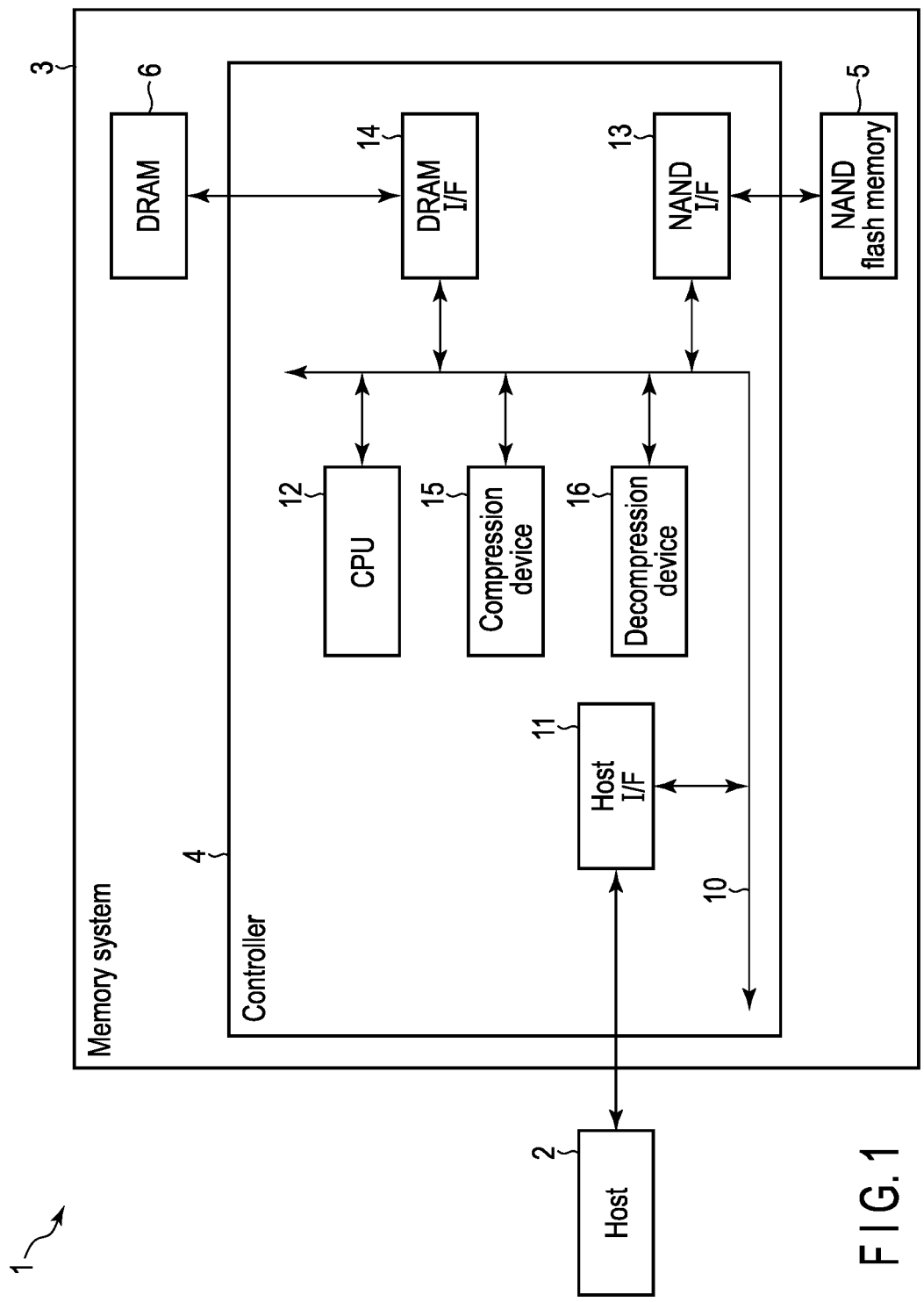
F I G. 1

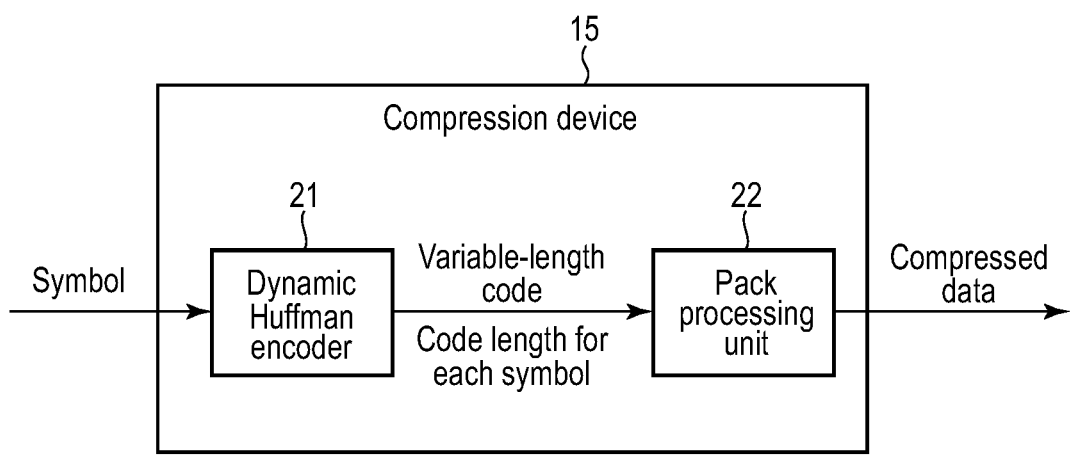
F I G. 2

| Symbol | Frequency of occurrence |
|---|---|
| a | 120 |
| b | 60 |
| c | 29 |
| d | 14 |
| e | 4 |
| f | 3 |
| g | 3 |
| h | 2 |
| i | 0 |
| j | 0 |
| ⋮ | ⋮ |

| Symbol | Code length |
|--------|-------------|
| a | 1 |
| b | 2 |
| c | 3 |
| d | 4 |
| e | 6 |
| f | 6 |
| g | 6 |
| h | 6 |

F I G. 7

| Symbol | Unconstrained code length | Constrained code length |
|---|---|---|
| a | 1 | 1 |
| b | 2 | 2 |
| c | 3 | 3 |
| d | 4 | 4 |
| e | 6 | 6→4 |
| f | 6 | 6→4 |
| g | 6 | 6→4 |
| h | 6 | 6→4 |

⇒ Kraft's inequality is not satisfied

} Change to upper limit

F I G. 14

| Symbol | Unconstrained code length | Constrained code length |
|---|---|---|
| a | 1 | 1 |
| b | 2 | 2 |
| c | 3 | 3→4 |
| d | 4 | 4 |
| e | 6 | 4 |
| f | 6 | 4 |
| g | 6 | 4 |
| h | 6 | 4 |

Change to upper limit

⇒ Kraft's inequality is not satisfied

F I G. 15

| Symbol | Unconstrained code length | Constrained code length |
|---|---|---|
| a | 1 | 1 |
| b | 2 | 2→4 |
| c | 3 | 4 |
| d | 4 | 4 |
| e | 6 | 4 |
| f | 6 | 4 |
| g | 6 | 4 |
| h | 6 | 4 |
Change to upper limit
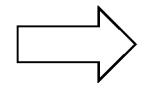  Kraft's inequality is satisfied
F I G. 16
| Symbol | Unconstrained code length | Constrained code length |
|---|---|---|
| a | 1 | 1 |
| b | 2 | 4→3 |
| c | 3 | 4 |
| d | 4 | 4 |
| e | 6 | 4 |
| f | 6 | 4 |
| g | 6 | 4 |
| h | 6 | 4 |
Decrease by one bit
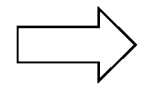  Left side of Kraft's inequality K=1
F I G. 17

```
code: = 0
while more symbols do //assign in ascending code length order and in predetermined symbol order in case of same code length
    code bit string of symbol=code
    code:=(code+1) << ((bit length of the next symbol) − (current bit length))
```

F I G. 18

| Symbol | Code length | Code bit string |
|--------|-------------|-----------------|
| B | 1 | 1'b0 |
| A | 2 | 2'b10 |
| C | 3 | 3'b110 |
| D | 3 | 3'b111 |

F I G. 19

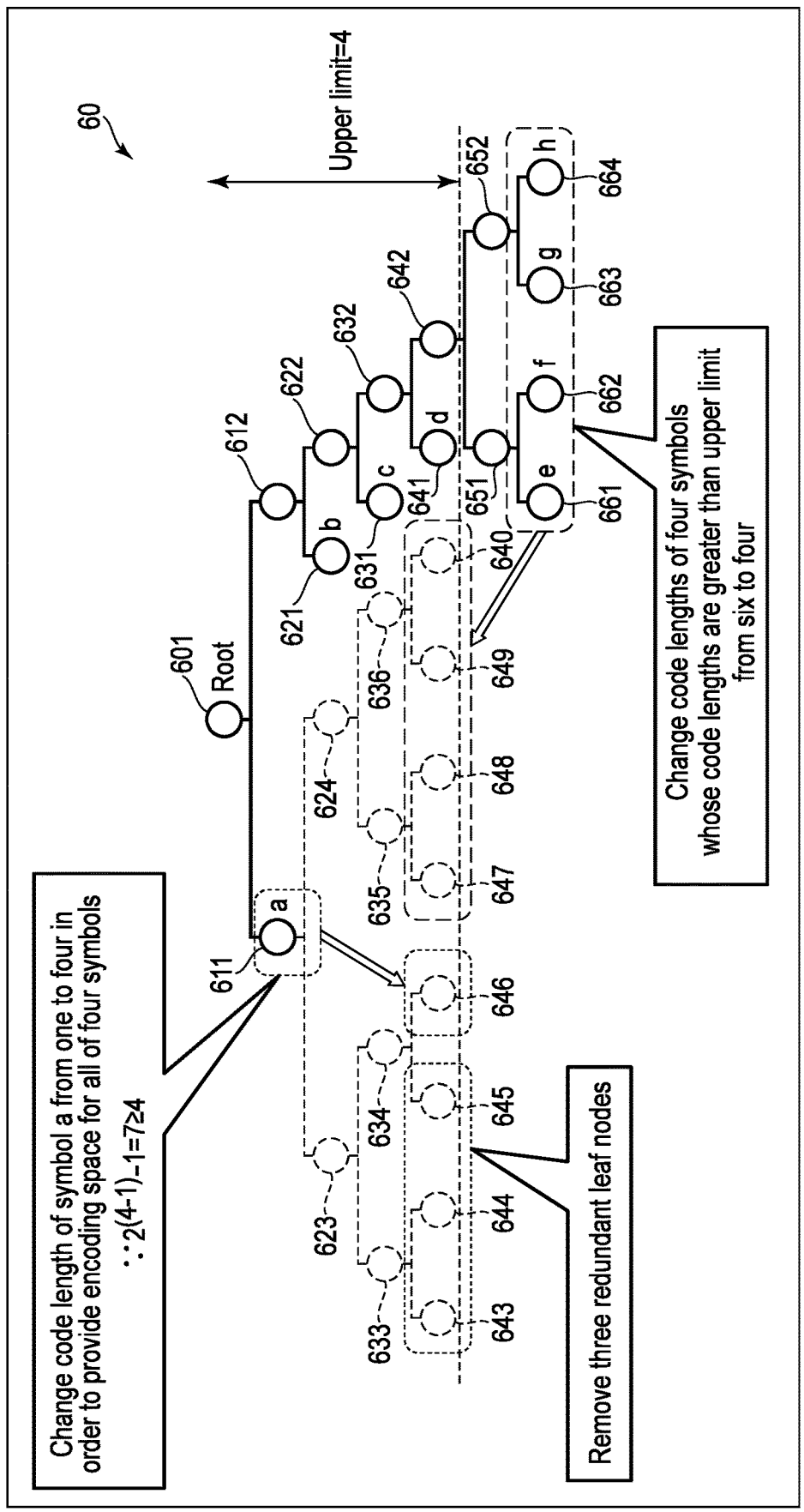
F I G. 21

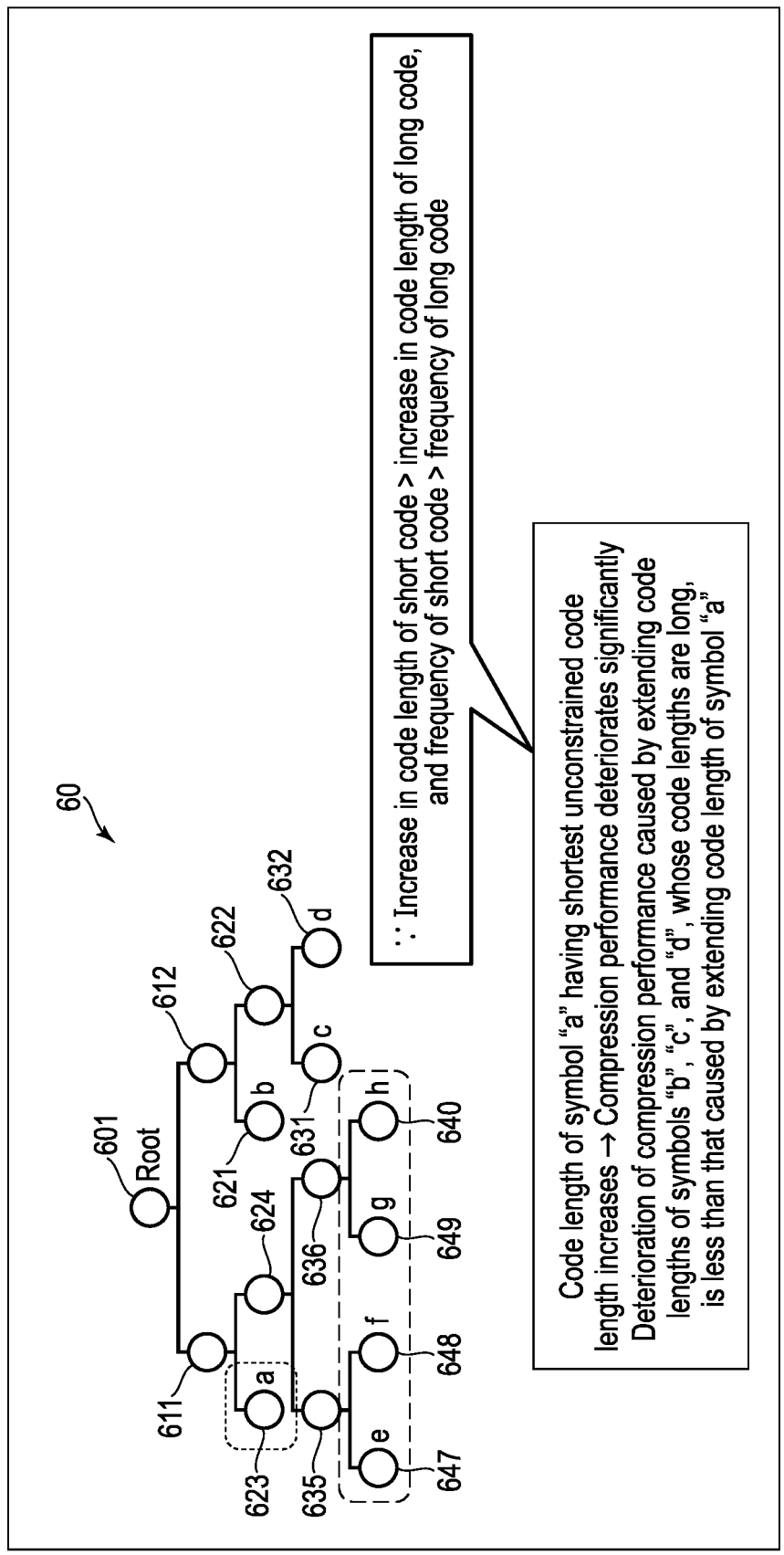

COMPRESSION DEVICE AND CONTROL METHOD

CROSS-REFERENCE TO RELATED APPLICATIONS

This application is based upon and claims the benefit of priority from Japanese Patent Application No. 2021-039512, filed Mar. 11, 2021, the entire contents of which are incorporated herein by reference.

FIELD

Embodiments described herein relate generally to a compression device and a control method.

BACKGROUND

Dynamic Huffman coding is variable-length coding for dynamically generating a coding table based on the frequency of occurrence of each of symbols to be encoded. In the dynamic Huffman coding, a short code word is assigned to a symbol that occurs at a high frequency and a long code word is assigned to a symbol that occurs at a low frequency.

Depending on constraints imposed by a data compression standard and constraints on the hardware implementation of compression and decompression devices, there is a case where the length of a code word (i.e., code length) assigned by the dynamic Huffman coding should be set so as not to exceed an upper limit based on the constraints. In this case, in the step of generating a coding table using the frequency of occurrence of each symbol, the length of a code word assigned to the symbol needs to be equal to or smaller than the upper limit.

BRIEF DESCRIPTION OF THE DRAWINGS

FIG. 1 is a block diagram illustrating an exemplary configuration of an information processing system including a compression device according to a first embodiment.

FIG. 2 is a block diagram illustrating an exemplary configuration of the compression device of the first embodiment.

FIG. 7 is a diagram illustrating an exemplary configuration of a code length table for use in the compression device of the first embodiment.

FIG. 14 is a diagram illustrating a modification to the code length table of FIG. 7 in the compression device of the first embodiment.

FIG. 15 is a diagram illustrating a modification to the code length table of FIG. 14 in the compression device of the first embodiment.

FIG. 16 is a diagram illustrating a modification to the code length table of FIG. 15 in the compression device of the first embodiment.

FIG. 17 is a diagram illustrating a modification to the code length table of FIG. 16 in the compression device of the first embodiment.

FIG. 18 is a diagram illustrating an example of a pseudo-program for assigning a code bit string to a symbol, which is executed in the compression device of the first embodiment.

FIG. 19 is a table illustrating an example of assigning a code bit string to a symbol in the compression device of the first embodiment.

FIG. 21 is a diagram illustrating a modification to a Huffman tree in the compression device of the comparative example.

FIG. 22 is a diagram illustrating a modification to the Huffman tree of FIG. 21 in the compression device of the comparative example.

DETAILED DESCRIPTION

Figure 3:
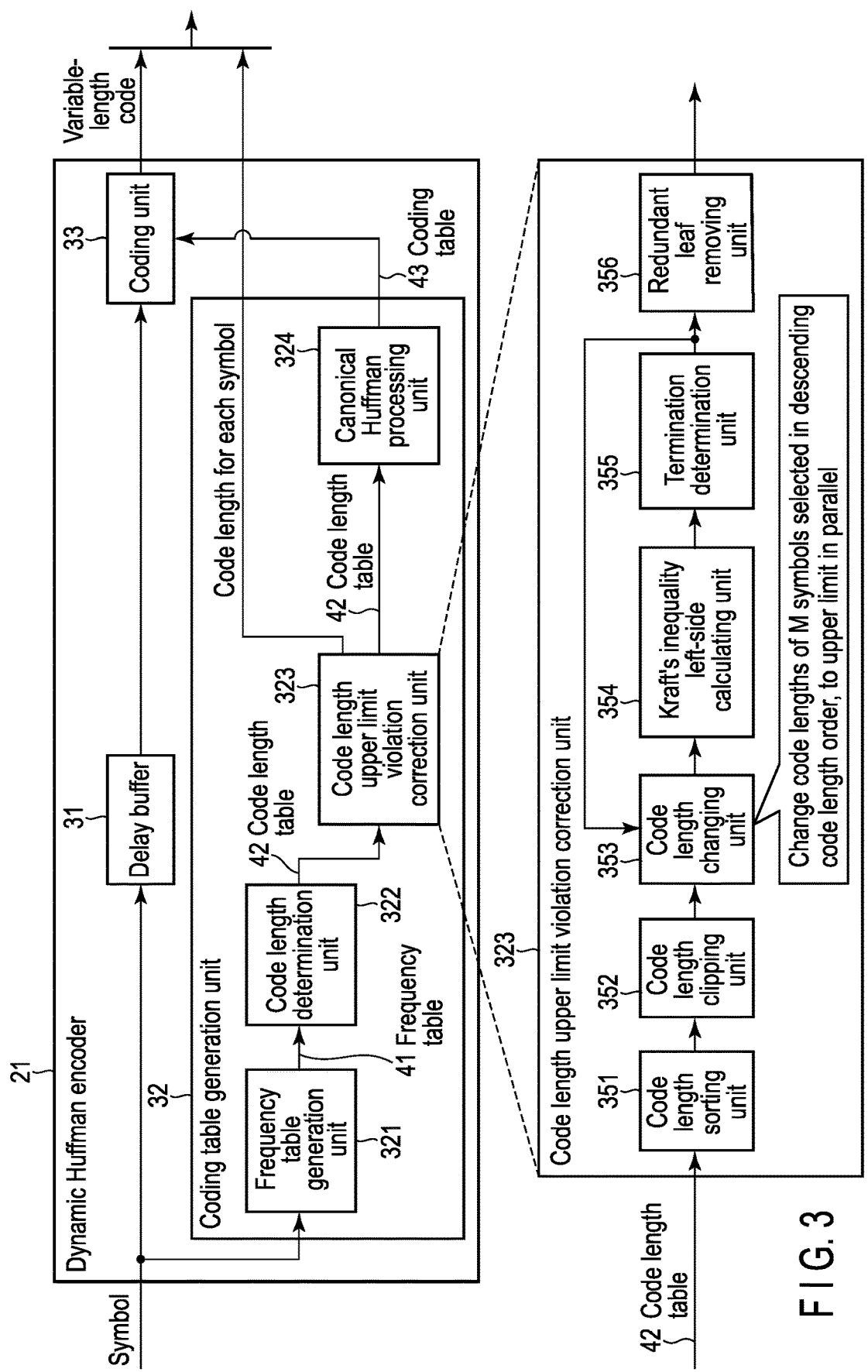
FIG. 3 is a block diagram illustrating an exemplary configuration of a dynamic Huffman encoder provided in the compression device of the first embodiment.

Embodiments will be described below with reference to the drawings.

In general, according to one embodiment, a compression device includes a coding information generation unit and a coding unit. The coding information generation unit determines a plurality of code lengths that are respectively associated with a plurality of symbols, based on a frequency of occurrence of each of the plurality of symbols. When the plurality of symbols include one or more first symbols that are respectively associated with one or more first code lengths exceeding an upper limit, the coding information generation unit changes the one or more first code lengths to the upper limit, selects, from one or more second symbols of the plurality of symbols that are respectively associated with one or more second code lengths shorter than the upper limit, at least one third symbol in descending associated code length order, changes at least one third code length associated with the at least one third symbol to the upper limit, and generates coding information that indicates the plurality of symbols and a plurality of variable-length codes that are respectively associated with the plurality of symbols, using at least the one or more first code lengths and the at least one third code length that are changed. The coding unit converts a symbol of the plurality of symbols into a variable-length code of plurality of variable-length codes using the coding information. A code length of each of the plurality of variable-length codes is a bit length from one to the upper limit.

First Embodiment

FIG. 1 illustrates an exemplary configuration of an information processing system 1 that includes a compression device 15 according to a first embodiment. The information processing system 1 includes a host device 2 (hereinafter referred to as a host 2) and a memory system 3.

The memory system 3 is a semiconductor storage device configured to write data in a nonvolatile memory such as a NAND flash memory 5 and read data from the nonvolatile memory. The memory system 3 is realized as, for example, a solid state drive (SSD) including the NAND flash memory 5. Hereinafter, the case where the memory system 3 is realized as an SSD will be exemplified, but the memory system 3 may be realized as a hard disk drive (HDD).

The host 2 may be a storage server that stores a large amount of various data in the memory system 3, or may be a personal computer.

The memory system 3 may be used as storage for the host 2. The memory system 3 may be built in the host 2 or may be connected to the host 2 via a cable or a network.

An interface for connecting the host 2 and the memory system 3 is conformable to SCSI, serial attached SCSI (SAS), AT attachment (ATA), serial ATA (SATA), PCI express (PCIe) (registered trademark), Ethernet (registered trademark), Fibre channel, NVM express (NVMe) (registered trademark), and the like.

The memory system 3 includes a controller 4 and the NAND flash memory 5. The controller 4 may be realized by a circuit such as a system-on-a-chip (SoC).

The controller 4 may include a random access memory (RAM) that is a volatile memory, such as a dynamic random access memory (DRAM) 6. Alternatively, a RAM such as a static random access memory (SRAM) may be built in the controller 4. Note that the DRAM 6 may also be built in the controller 4.

A RAM such as the DRAM 6 includes, for example, a storage area for firmware (FW) loaded from the NAND flash memory 5.

The NAND flash memory 5 includes multiple blocks. Each of the blocks includes multiple pages. The blocks each function as a minimum erase unit. A block may be referred to as an erase block or a physical block. Each of the pages includes multiple memory cells connected to a single word line. The pages each function as a unit of a data write operation and a data read operation. Note that a word line may be used as a unit of a data write operation and a data read operation.

The tolerable maximum number of program/erase cycles (maximum number of P/E cycles) for each of the blocks is limited. One P/E cycle of a block includes an erase operation to erase data stored in all memory cells in the block and a write operation to write data in each page of the block.

The controller 4 may include a host interface (host I/F) 11, a CPU 12, a NAND interface (NAND I/F) 13, a DRAM interface (DRAM I/F), 14 and a compression device 15. The host I/F 11, the CPU 12, the NAND I/F 13, the DRAM I/F, 14 and the compression device 15 may be mutually connected through a bus 10.

The controller 4 is electrically connected to the NAND flash memory 5 through the NAND I/F 13 conformable to an interface standard such as a Toggle DDR or an open NAND flash interface (ONFI). The NAND I/F 13 functions as a NAND control circuit configured to control the NAND flash memory 5.

The controller 4 functions as a memory controller configured to control the NAND flash memory 5.

The controller 4 may function as a flash translation layer (FTL) configured to execute data management and block management of the NAND flash memory 5. The data management executed by the FTL includes (1) management of mapping data indicative of relationship between each logical address and each physical address of the NAND flash memory 5, (2) process to hide read/write operations in units of page and erase operations in units of block, and the like. The logical address is an address used by the host 2 for addressing the memory system 3.

The management of mapping between each logical address and each physical address may be executed by using a logical-to-physical address conversion table. The controller 4 manages mapping between each logical address and each physical address with a certain management size unit by using the logical-to-physical address conversion table. A physical address corresponding to a logical address indicates a physical memory location in the NAND flash memory 5 to which data of the logical address is written. The logical-to-physical address conversion table may be loaded to the DRAM 6 from the NAND flash memory 5 when the memory system 3 is powered on.

Data write into one page is executable only once in a single P/E cycle. Thus, the controller 4 writes update data corresponding to a logical address not to an original physical memory location in which previous data corresponding to the logical address is stored but to a different physical memory location. Then, the controller 4 updates the logical-to-physical address conversion table to associate the logical address with the different physical memory location and to invalidate the previous data.

The block management includes defective block management, wear leveling and garbage collection.

The host I/F 11 is a hardware interface that performs communication between the memory system 3 and the host 2 that is an external device of the memory system 3. The host I/F 11 functions as a circuit that receives various commands such as I/O commands and various control commands from the host 2. The I/O commands may include a write command and a read command. The control commands may include an unmap command (trim command) and a format command. The host I/F 11 also functions as a transmission circuit that transmits to the host 2 a response or data in accordance with a command.

The DRAM I/F 14 functions as a DRAM control circuit configured to control accesses to the DRAM 6. The storage area of the DRAM 6 is allocated to an area for storing the FW and a buffer area used as a read/write buffer or the like.

The CPU 12 is a processor configured to control the host I/F 11, the NAND I/F 13, and the DRAM I/F 14.

The CPU 12 executes various types of processing by executing the FW loaded in the DRAM 6. That is, the FW is control programs for controlling the operation of the CPU 12. The CPU 12 may perform, in addition to the above-described processes of FTL, command processes to process various commands from the host 2. Note that part of or the entire FTL processes and the command processes may be executed by a dedicated hardware in the controller 4.

The compression device 15 encodes data, which is to be written into the NAND flash memory 5, to compress the data. The compression device 15 encodes, for example, plain text data received in response to receiving a write command from the host 2. To compress the data, the compression device 15 has a component to achieve, for example, dynamic Huffman coding.

FIG. 2 illustrates an exemplary configuration of the compression device 15. The compression device 15 includes, for example, a dynamic Huffman encoder 21 and a pack processing unit 22.

The dynamic Huffman encoder 21 performs dynamic Huffman coding for an input symbol. The dynamic Huffman coding is variable-length coding for dynamically generating a coding table using the frequency of occurrence of each of symbols to be encoded. The coding table includes information that indicates a plurality of symbols and a plurality of variable-length codes (code words) which are associated with the plurality of symbols, respectively. In the dynamic Huffman coding, a short code word is assigned to a symbol that occurs at a high frequency and a long code word is assigned to a symbol that occurs at a low frequency. In accordance with this assignment, the dynamic Huffman encoder 21 converts an input symbol into a code word. That is, the code word obtained by the conversion is a variable-length code. Note that the symbol is, for example, fixed-length data.

The dynamic Huffman encoder 21 sends the variable-length code, which is obtained by the dynamic Huffman coding, to the pack processing unit 22. The dynamic Huffman encoder 21 also sends the lengths of the variable-length codes (i.e., code lengths), which are assigned to symbols shown in the coding table, respectively, to the pack processing unit 22 in specific symbol order. The specific symbol order is, for example, an order conforming to the corresponding symbols in an alphabetical order. That is, the code lengths arranged in the specific symbol order are, for example, code lengths arranged so as to correspond to the symbols, respectively, that are arranged in alphabetical order.

The pack processing unit 22 may collect one or more variable-length codes output from the dynamic Huffman encoder 21 and output the collected variable-length codes as compressed data (compressed stream) for each specific data size. The pack processing unit 22 inserts the code lengths, which are arranged in the specific symbol order, as a header of the compressed data. The code lengths arranged in the specific symbol order are used to restore the coding table (decoding table) when a decompression device 16 decodes the compressed data.

Part or all of the dynamic Huffman encoder 21 and the pack processing unit 22 may be implemented as hardware such as a circuit or as programs (i.e., software) executed by at least one processor.

Note that the controller 4 may include the decompression device 16. The decompression device 16 decodes compressed data read from the NAND flash memory 5 to decompress the compressed data. The decompression device 16 decodes compressed data that is read from the NAND flash memory 5 in accordance with, for example, a read command received from the host 2 by the controller 4. The controller 4 transmits, to the host 2, the decoded data as a response to the read command. The decompression device 16 has a configuration to decompress (i.e., inversely convert) compressed data in accordance with the configuration for compression by the compression device 15.

The controller 4 may further include an ECC encoder and an ECC decoder. The ECC encoder generates a parity (ECC parity) for error correction with respect to the compressed data output from the pack processing unit 22, and generates a code word having the generated ECC parity and the compressed data. The CPU 12 is configured to write the code word into the NAND flash memory 5 via the NAND I/F 13. When the controller 4 reads data from the NAND flash memory 5 in accordance with, for example, a read command issued from the host 2, the CPU 12 reads the code word from the NAND flash memory 5 via the NAND I/F 13, and the ECC decoder performs an error detection process and an error correction process for the read code word to generate compressed data. The decompression device 16 is configured to decompress the generated compressed data. That is, the controller 4 may be configured to write data based on the compressed data output from the pack processing unit 22 into the NAND flash memory 5, and generate compressed data based on data read from the NAND flash memory 5 and decompress the generated compressed data.

FIG. 3 is a block diagram illustrating an exemplary configuration of the dynamic Huffman encoder 21. The dynamic Huffman encoder 21 includes, for example, a delay buffer 31, a coding table generation unit 32 and a coding unit 33.

The delay buffer 31 stores (buffers) symbols input to the dynamic Huffman encoder 21. The delay buffer 31 delays the stored symbols for, for example, a specific time period and sends them to the coding unit 33.

The coding table generation unit 32 generates a coding table 43 using the symbols input to the dynamic Huffman encoder 21. The coding table 43 includes information indicative of the symbols and variable-length codes (i.e., code bit strings) that are associated with the symbols, respectively.

More specifically, the coding table generation unit 32 generates the coding table 43 on the basis of the frequency of occurrence of each of the symbols that are included in input data of a specific unit in consideration of constraints on an upper limit of code length. The specific unit may be a specific data amount unit or may be a specific group such as a file. When a specific group is used as a unit, the coding table generation unit 32 detects data indicating the termination of the input data to recognize the input data in specific unit. The constraints on the upper limit of code length are constraints on the upper limit of lengths of variable-length codes (code lengths) into which symbols are converted with dynamic Huffman coding. The upper limit of code length is determined based on constraints defined in the data compression standard and constraints in the hardware implementation of the compression device 15 and the decompression device 16. In accordance with the constraints on the upper limit of code length, the coding table generation unit 32 generates the coding table 43 such that the length of a variable-length code assigned to each of the symbols shown in the coding table 43 does not exceed the upper limit based on the constraints.

The coding table generation unit 32 includes, for example, a frequency table generation unit 321, a code length determination unit 322, a code length upper limit violation correction unit 323, and a canonical Huffman processing unit 324.

The frequency table generation unit 321 generates a frequency table 41 using input symbols. The frequency table 41 is a table that indicates symbols and the frequency of occurrence of each of the symbols. A specific exemplary configuration of the frequency table 41 will be described later with reference to FIG. 5.

The code length determination unit 322 determines code lengths which are associated with the symbols, respectively, using the frequency table 41. For example, the code length determination unit 322 associates a short code length with a symbol which occurs at a high frequency and associates a long code length with a symbol which occurs at a low frequency. The code length associated with a symbol is the length of a variable-length code (i.e., a code bit string) assigned to the symbol. The code length is expressed by, for example, a length in units of bits. Hereinafter, the code length associated with a symbol will simply be referred to as the code length of a symbol. Note that the code length determination unit 322 does not consider the constraints on the upper limit of code length when determining the code length of each of the symbols. A specific operation of the code length determination unit 322 will be described later with reference to FIG. 4.

When there is a constraint on an upper limit of code length and the symbols shown in the code length table 42 include a symbol associated with the code length exceeding the upper limit, the code length upper limit violation correction unit 323 changes (corrects) the code length of the symbol to the upper limit. The code length upper limit violation correction unit 323 selects at least one symbol from one or more symbols of the symbols shown in the code length table 42, in decreasing order of the associated code length. The one or more symbols are associated with code lengths, respectively, that are less than the upper limit. The code length upper limit violation correction unit 323 also changes the code length associated with the at least one selected symbol to the upper limit.

The code length upper limit violation correction unit 323 sends the code length table 42 including the corrected code lengths to the canonical Huffman processing unit 324. In addition, the code length upper limit violation correction unit 323 sends the code lengths shown in the code length table 42 including the corrected code lengths to the pack processing unit 22 in specific symbol order. The specific symbol order is, for example, an order conforming to the corresponding symbols in alphabetical order.

When the code length table 42 generated by the code length determination unit 322 does not include a code length exceeding the upper limit, the code length upper limit violation correction unit 323 sends the code length table 42 to the canonical Huffman processing unit 324 as it is. The code length upper limit violation correction unit 323 also sends the code lengths of the symbols shown in the code length table 42 to the pack processing unit 22 in the specific symbol order.

The code length upper limit violation correction unit 323 includes, for example, a code length sorting unit 351, a code length clipping unit 352, a code length changing unit 353, a Kraft's inequality left-side calculating unit 354, a termination determination unit 355, and a redundant leaf removing unit 356. The operations of these units will be described later with reference to FIGS. 8 and 9.

The canonical Huffman processing unit 324 generates a coding table 43 by, for example, canonical Huffman coding using the code length table 42 including the code lengths corrected by the code length upper limit violation correction unit 323. The code length table 42 including the corrected code lengths may include, for example, at least a code length changed from a length exceeding the upper limit to the upper limit and a code length changed from a length below the upper limit to the upper limit. The canonical Huffman coding is capable of determining a code bit string (variable-length code) to be assigned to each of symbols, using only the code lengths of the symbols. The canonical Huffman processing unit 324 sends the generated coding table 43 to the coding unit 33. A specific operation of the canonical Huffman processing unit 324 will be described later with reference to FIGS. 18 and 19.

The coding unit 33 converts a symbol sent by the delay buffer 31 into a variable-length code (code bit string) using the coding table 43 sent by the canonical Huffman processing unit 324. The coding unit 33 sends the variable-length code obtained by the conversion to the pack processing unit 22.

With the foregoing configuration, the dynamic Huffman encoder 21 can dynamically Huffman-encode an input symbol, thereby converting it into a variable-length code.

Here, the specific operations of the code length determination unit 322, the code length upper limit violation correction unit 323 and the canonical Huffman processing unit 324 in the coding table generation unit 32 will be explained respectively.

Figure 4:
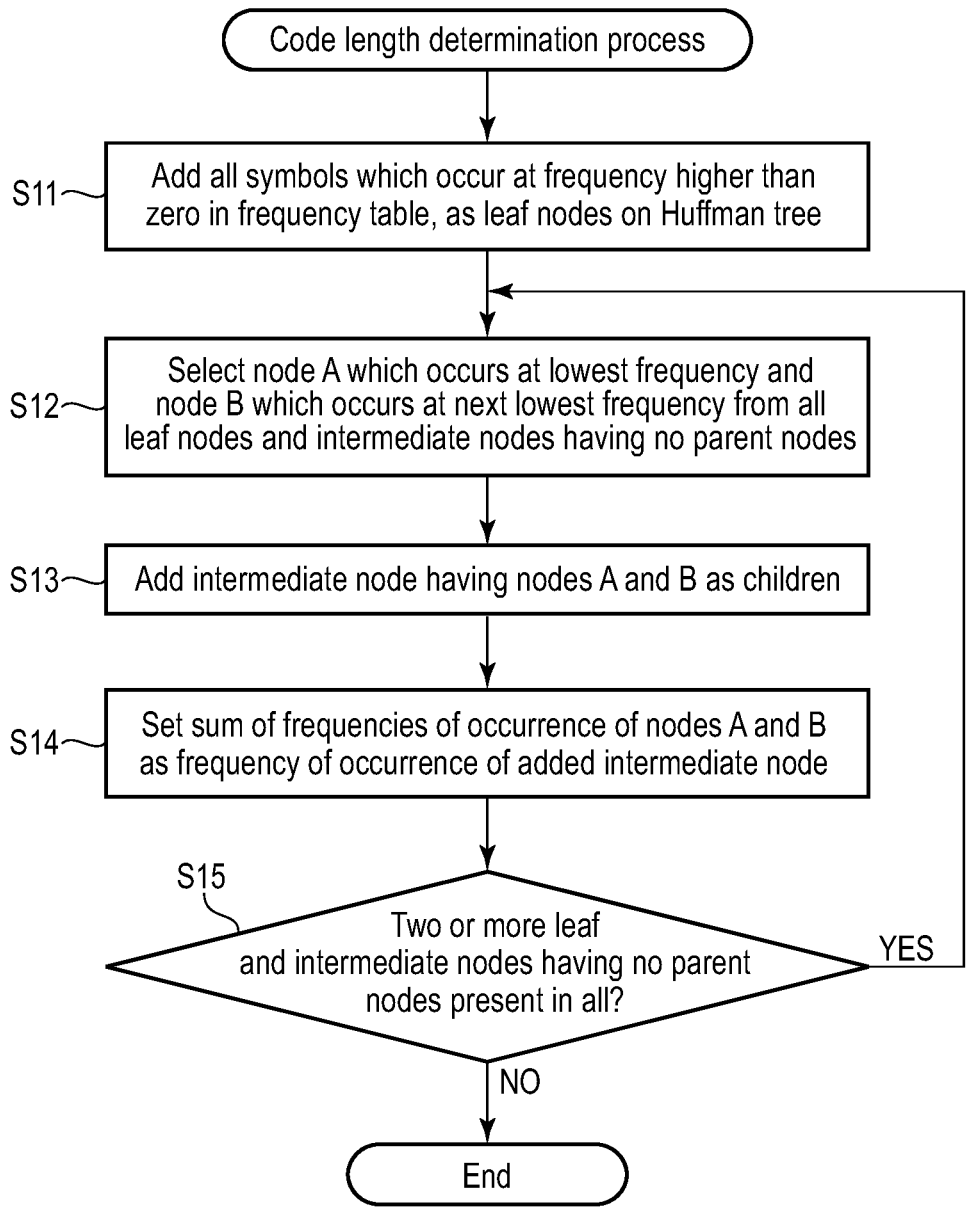
FIG. 4 is a flowchart illustrating an example of the procedure of a code length determination process performed in the compression device of the first embodiment.

FIG. 4 is a flowchart illustrating an example of the procedure of a code length determination process performed by the code length determination unit 322. The code length determination process is a process for determining a code length of each of the symbols using the frequency table 41. The code length determination unit 322 performs the code length determination process when, for example, the frequency table 41 corresponding to the symbols included in input data in specific unit has been generated.

First, the code length determination unit 322 adds all symbols which occur at frequency higher than zero in the frequency table 41, as leaf nodes on a Huffman tree (step S11). That is, the code length determination unit 322 generates a Huffman tree including leaf nodes corresponding to the number of symbols which occur at frequency higher than zero in the frequency table 41.

Then, the code length determination unit 322 selects a node A which occurs at the lowest frequency and a node B which occurs at the next lowest frequency from all leaf nodes and intermediate nodes having no parent nodes in the Huffman tree (step S12). The code length determination unit 322 adds an intermediate node having the selected nodes A and B as children to the Huffman tree (step S13). Then, the code length determination unit 322 sets the sum of frequencies of occurrence of the nodes A and B as the frequency of occurrence of the added intermediate node (step S14).

The code length determination unit 322 determines whether two or more leaf and intermediate nodes having no parent nodes are present in all in the Huffman tree (step S15). When two or more leaf and intermediate nodes having no parent nodes are present in all in the Huffman tree (YES in step S15), the process in the code length determination unit 322 proceeds to step S12. That is, the code length determination unit 322 further performs a procedure for adding an intermediate node that has leaf and intermediate nodes having no parent nodes as children.

When the number of leaf and intermediate nodes having no parent nodes in the Huffman tree is less than two (No in step S15), the code length determination unit 322 ends the code length determination process.

With the foregoing code length determination process, the code length determination unit 322 can construct a Huffman tree. The constructed Huffman tree includes leaf nodes corresponding to their respective symbols which occur at a frequency of one or more. The code length determination unit 322 constructs a Huffman tree bottom-up from a leaf node corresponding to a symbol which occurs at a low frequency. The code length determination unit 322 can determine the code length of each of the symbols using the constructed Huffman tree. The depth of a leaf node starting from the root node corresponds to the code length of a corresponding symbol. Thus, the code length determination unit 322 can determine the code length of a symbol using the Huffman tree.

A specific example of generating the code length table 42 using the frequency table 41 will be described with reference to FIGS. 5 to 7.

Figures 5, 6:
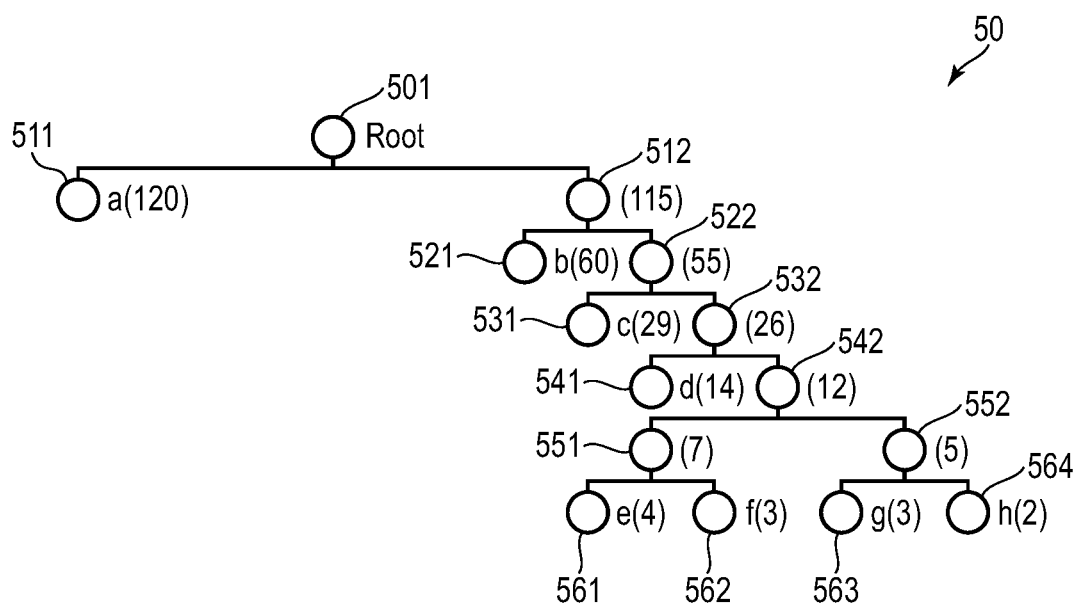
FIG. 5 is a diagram illustrating an exemplary configuration of a frequency table for use in the compression device of the first embodiment.
FIG. 6 is a diagram illustrating an example of a Huffman tree generated in the compression device of the first embodiment.

FIG. 5 illustrates an exemplary configuration of the frequency table 41 generated by the frequency table generation unit 321. The frequency table 41 includes entries that correspond to symbols, respectively. Each of the entries includes, for example, a symbol field and an occurrence frequency field.

The symbol field indicates a corresponding symbol.

The occurrence frequency field indicates the frequency of occurrence of a corresponding symbol. More specifically, the occurrence frequency field indicates, for example, the number of times of occurrence of the corresponding symbol in the input data that is processed, for example.

Hereinafter, a value indicated in the symbol field will simply be referred to as symbol. The same applies to values indicated in other fields of the frequency table 41 and values indicated in fields of other tables.

In the example illustrated in FIG. 5, the frequency of occurrence of a symbol "a" is 120. The frequency of occurrence of a symbol "b" is 60. The frequency of occurrence of a symbol "c" is 29. The frequency of occurrence of a symbol "d" is 14. The frequency of occurrence of a symbol "e" is 4. The frequency of occurrence of each of symbols "f" and "g" is 3. The frequency of occurrence of a symbol "h" is 2. The frequency of occurrence of each of symbols "i" and "j" is 0.

FIG. 6 illustrates an example of a Huffman tree 50 generated by the code length determination unit 322. Here is an illustration of a case where the code length determination unit 322 generates the Huffman tree 50 using the frequency table 41 shown in FIG. 5.

First, the code length determination unit 322 selects, from the frequency table 41, the eight symbols "a", "b", "c", "d", "e", "f", "g", and "h" whose occurrence frequencies are higher than zero. The code length determination unit 322 generates a Huffman tree 50 including eight leaf nodes 511, 521, 531, 541, 561, 562, 563, and 564 to which the selected eight symbols are assigned, respectively. In each of the leaf nodes, the frequency of occurrence of the corresponding symbol is set. Hereinafter, a set of symbols to which leaf nodes are assigned (i.e., a set of symbols whose occurrence frequencies are higher than zero) will also be referred to as a set of symbols S.

The code length determination unit 322 selects the leaf node 564 of the symbol "h" whose occurrence frequency is lowest and the leaf node 563 of the symbol "g" whose occurrence frequency is next lowest from all leaf and intermediate nodes having no parent nodes of the Huffman tree 50. Then, the code length determination unit 322 adds an intermediate node 552 having the selected leaf nodes 564 and 563 as children to the Huffman tree 50. The code length determination unit 322 sets the sum of the frequency of occurrence of the leaf node 564 and the frequency of occurrence of the leaf node 563 (=2+3=5) as the frequency of occurrence of the intermediate node 552.

Next, the code length determination unit 322 selects the leaf node 562 of the symbol "f" whose occurrence frequency is lowest and the leaf node 561 of the symbol "e" whose occurrence frequency is next lowest from all leaf and intermediate nodes having no parent nodes of the Huffman tree 50. The code length determination unit 322 then adds an intermediate node 551 having the selected leaf nodes 562 and 561 as children to the Huffman tree 50. The code length determination unit 322 sets the sum of the frequency of occurrence of the leaf node 562 and the frequency of occurrence of the leaf node 561 (=3+4=7) as the frequency of occurrence of the added intermediate node 551.

Then, the code length determination unit 322 selects the intermediate node 552 whose occurrence frequency is lowest and the intermediate node 551 whose occurrence frequency is next lowest from all leaf and intermediate nodes having no parent nodes of the Huffman tree 50. The code length determination unit 322 then adds an intermediate node 542 having the selected intermediate nodes 552 and 551 as children to the Huffman tree 50. The code length determination unit 322 sets the sum of the frequency of occurrence of the intermediate node 552 and the frequency of occurrence of the intermediate node 551 (=5+7=12) as the frequency of occurrence of the added intermediate node 542.

Similarly, the code length determination unit 322 repeats the operation of adding an intermediate node until the number of the leaf and intermediate nodes having no parent nodes becomes one or less (i.e., until a root node 501 is only obtained as a node having no parent node) in the Huffman tree 50. Accordingly, the Huffman tree 50 shown in FIG. 6 can be constructed. The code length determination unit 322 generates a code length table 42 using the constructed Huffman tree 50. The code length table 42 is a table for managing symbols and code lengths associated with the symbols, respectively.

Specifically, the code length determination unit 322 determines the code length of each of the eight symbols "a", "b", "c", "d", "e", "f", "g", and "h" using the constructed Huffman tree 50. The depth of a leaf node corresponding to a symbol starting from the root node 501 indicates the code length of the symbol. For example, the depth of the leaf node 511 of the symbol "a" starting from the root node 501 is one. Thus, the code length of the symbol "a" is one bit. For example, the depth of the leaf node 564 of the symbol "h" starting from the root node 501 is six. Thus, the code length of the symbol "h" is six bits.

Figure 7:
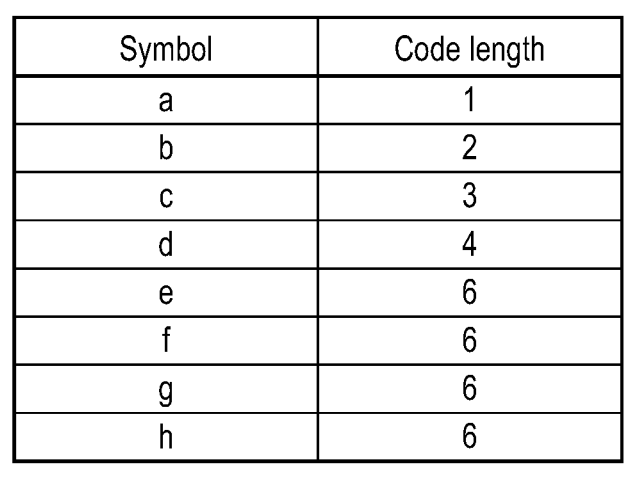

FIG. 7 is a diagram illustrating an exemplary configuration of the code length table 42 generated by the code length determination unit 322. The code length table 42 includes entries that correspond to symbols, respectively. Each of the entries includes, for example, a symbol field and a code length field.

The symbol field indicates a corresponding symbol.

The code length field indicates a code length that is determined for the corresponding symbol by the code length determination unit 322. As described above, the code length is determined based on the depth of the leaf node of the corresponding symbol starting from the root node 501 in the Huffman tree 50. Hereinafter, the code length determined by the code length determination unit 322 may be referred to as an unconstrained code length. That is, the unconstrained code length is a code length determined on the basis of the frequencies of occurrence of symbols, without considering the constraint of the upper limit of code length.

In FIG. 7, the code length table 42 generated using the Huffman tree 50 shown in FIG. 6 is illustrated. Specifically, the code length table 42 indicates that the code length (unconstrained code length) of the symbol "a" is one bit. The code length table 42 indicates that the code length of the symbol "b" is two bits. The code length table 42 indicates that the code length of the symbol "c" is three bits. The code length table 42 indicates that the code length of the symbol "d" is four bits. The code length table 42 indicates that the code length of each of the symbols "e", "f", "g", and "h" is six bits.

Next is a description of a specific example of the operation of the code length upper limit violation correction unit 323. The code length upper limit violation correction unit 323 corrects a code length exceeding the upper limit to the upper limit or less using the code length table 42 generated by the code length determination unit 322.

Figure 8:
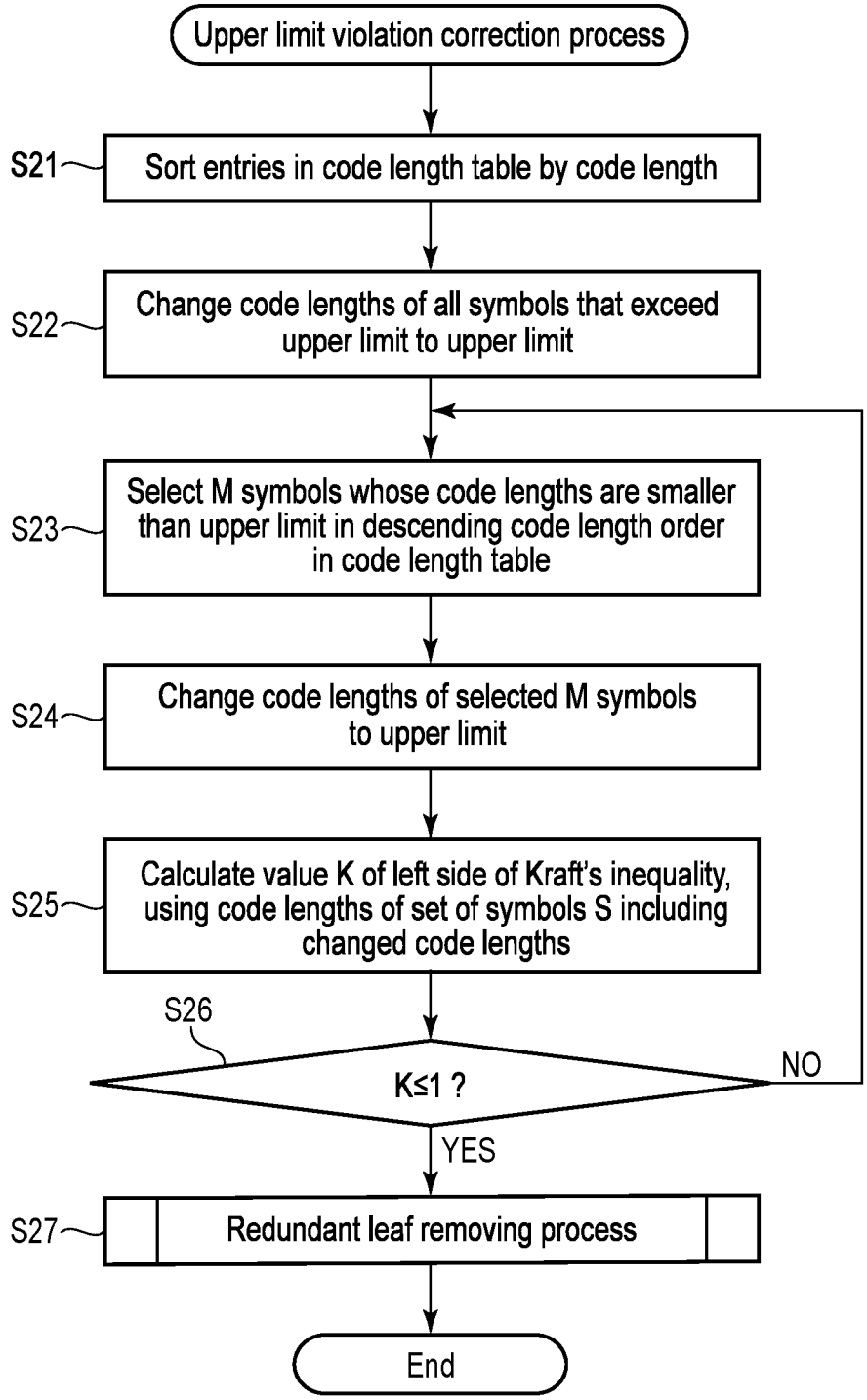
FIG. 8 is a flowchart illustrating an example of the procedure of an upper limit violation correction process performed in the compression device of the first embodiment.

FIG. 8 is a flowchart showing an example of the procedure of an upper limit violation correction process performed by the code length upper limit violation correction unit 323. The upper limit violation correction process is a process for, when the upper limit of code length associated with a symbol is set, correcting a code length exceeding the upper limit to the upper limit or less. The code length upper limit violation correction unit 323 starts to perform the upper limit violation correction process after the code length determination process shown in FIG. 4 is completed, for example.

First, the code length sorting unit 351 of the code length upper limit violation correction unit 323 sorts the entries in the code length table 42 by code length (step S21). The code length sorting unit 351 sorts the entries in the code length table 42 in ascending code length order, for example. Then, the code length clipping unit 352 changes the code lengths of all symbols exceeding the upper limit to the upper limit in the code length table 42 (step S22).

Next, the code length changing unit 353 selects M symbols whose code lengths are smaller than the upper limit in descending code length order in the code length table 42 (step S23). M is an integer of one or more. The code length changing unit 353 changes, in parallel, the code lengths of the M symbols selected in the code length table 42 to the upper limit (step S24). Thus, M indicates the number of symbols whose code lengths are changed in parallel. The greater M, the larger the number of symbols whose code lengths are changed to the upper limit at once. Hereinafter, M will also be referred to as the degree of parallelism.

The Kraft's inequality left-side calculating unit 354 calculates a value K of the left side of the Kraft's inequality using the code lengths of the set of symbols S including the changed code lengths (step S25). The set of symbols S is composed of all the symbols included in the code length table 42. The Kraft's inequality is expressed by the following expression (1).

$$\Sigma_{s \in S} 2^{-l(s)} \leq 1 \qquad \text{Expression (1)}$$

where s represents a symbol belonging to the set of symbols S, l(s) represents a code length associated with the symbol s.

If the set of symbols S and the code length l(s) of each symbol s∈S satisfy the Kraft's inequality, the existence of a valid coding table 43 is guaranteed. That is, encoding and decoding can correctly be performed using the coding table 43 generated on the basis of the code length l(s) of each symbol s∈S.

On the other hand, if the set of symbols S and the code length l(s) of each symbol s∈S do not satisfy the Kraft's inequality, there is no valid coding table 43. Therefore, encoding or decoding cannot correctly be performed using the coding table 43 generated on the basis of the code length l(s) of each symbol s∈S.

The termination determination unit 355 determines whether the calculated value K of the left side of the Kraft's inequality is one or less (step S26). That is, the termination determination unit 355 determines whether the code lengths l(s) of the symbols s included in the set of symbols S shown in the current code length table 42 satisfy the Kraft's inequality. If the value K of the left side of the Kraft's inequality is larger than one (No in step S26), the process in the code length upper limit violation correction unit 323 returns to step S23. That is, the code length changing unit 353 and the Kraft's inequality left-side calculating unit 354 repeats a first process until the code lengths l(s) of symbols s included in the set of symbols S shown in the code length table 42 satisfy the Kraft's inequality (that is, until the value of the left side of the Kraft's inequality is equal to or less than one). The first process includes selecting M symbols whose code lengths are smaller than the upper limit, which have not yet selected, in descending associated code length order, changing the code lengths of the selected M symbols to the upper limit, and calculating the value K of the left side of the Kraft's inequality.

As described above, the number of symbols whose code lengths are changed to the upper limit at once increases as M becomes larger. The number of cycles to satisfy the Kraft's inequality when M is set to two or more can be reduced more than when M is one. The number of cycles here refers to the number of times a process for one cycle is performed, with one performance of the process from step S23 to step S25 as the one cycle. The code length upper limit violation correction unit 323 may set the value of M to satisfy, for example, an upper limit of latency required for the compression device 15.

When the value K of the left side of the Kraft's inequality is one or less (Yes in step S26), the redundant leaf removing unit 356 performs a redundant leaf removing process (step S27), and ends the upper limit violation correction process. The redundant leaf removing process is a process for removing a redundant leaf node from the Huffman tree 50. The redundant leaf node is generated by changing a code length, which is smaller than the upper limit, to the upper limit. The specific procedure of the redundant leaf removing process will be described later with reference to the flowchart shown in FIG. 9.

Through the foregoing upper limit violation correction process, the code length upper limit violation correction unit 323 can change a code length exceeding the upper limit, associated with a symbol, to the upper limit. With this change, the code lengths l(s) of the symbols s included in the set of symbols S shown in the code length table 42 do not satisfy the Kraft's inequality. Thus, the code length upper limit violation correction unit 323 repeats a process of selecting M symbols whose code lengths are smaller than the upper limit and changing the code lengths of the selected M symbols to the upper limit, until the Kraft's inequality is satisfied. Thus, the code length upper limit violation correction unit 323 can acquire the code length table 42 including the set of symbols S associated with code lengths which are equal to or less than the upper limit and which satisfy the Kraft's inequality.

Figure 9:
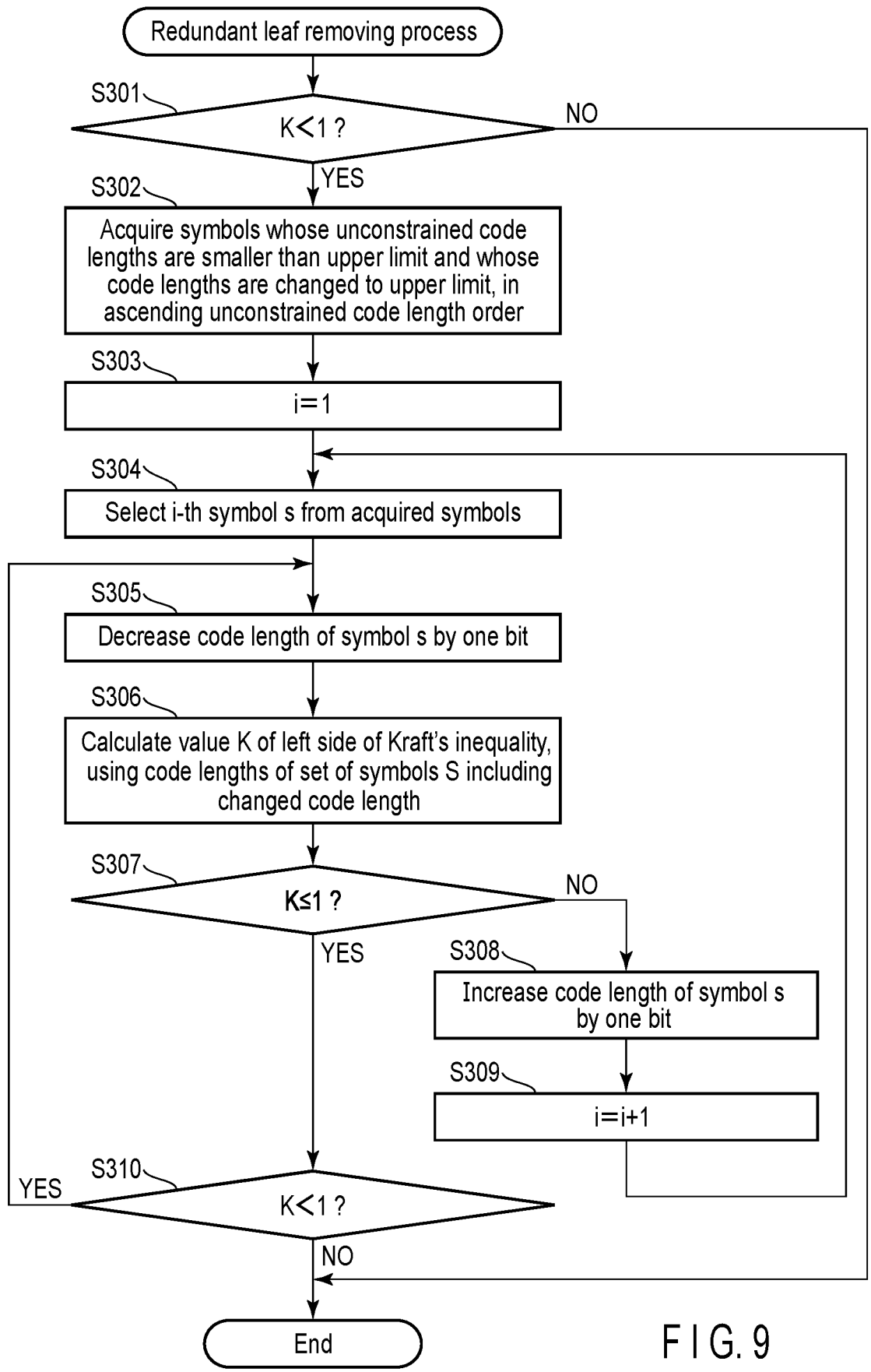
FIG. 9 is a flowchart illustrating an example of the procedure of a redundant leaf removing process performed in the compression device of the first embodiment.

FIG. 9 is a flowchart showing an example of the procedure of a redundant leaf removing process performed by the redundant leaf removing unit 356. The redundant leaf removing process corresponds to step S27 of the upper limit violation correction process described above with reference to FIG. 8.

First, the redundant leaf removing unit 356 determines whether the value K of the left side of the Kraft's inequality is less than one (step S301). Note that the value K is a value calculated by the Kraft's inequality left-side calculating unit 354 in step S25 of the upper limit violation correction process described above with reference to FIG. 8 immediately before the redundant leaf removing process is performed. The value K is therefore one or smaller.

When the value K is not less than one (No in step S301), that is, when it is one, the redundant leaf removing unit 356 ends the redundant leaf removing process. In other words, when the value K is one, the redundant leaf removing unit 356 determines that there is no redundant leaf node in the Huffman tree 50. The redundant leaf removing unit 356 thus ends the redundant leaf removing process.

When the value K is less than one (Yes in step S301), the redundant leaf removing unit 356 acquires symbols whose unconstrained code lengths are less than the upper limit and whose code lengths are changed to the upper limit, in ascending unconstrained code length order (step S302). The redundant leaf removing unit 356 determines that there is at least one redundant leaf node in the Huffman tree 50 when the value K is less than one. The redundant leaf removing unit 356 sets a variable i to one (step S303). The variable i is used for specifying one symbol included in the acquired symbols.

Then, the redundant leaf removing unit 356 selects the i-th symbol s from the acquired symbols (step S304). The redundant leaf removing unit 356 decreases the code length of the symbol s by one bit (step S305). The redundant leaf removing unit 356 calculates the value K of the left side of the Kraft's inequality using the code lengths of the set of symbols S including the changed code length (step S306). Note that the value K may be calculated by the Kraft's inequality left-side calculating unit 354. Then, the redundant leaf removing unit 356 determines whether the calculated value K is equal to or less than one (step S307). That is, the redundant leaf removing unit 356 determines whether the code lengths of the set of symbols S including the changed code length satisfies the Kraft's inequality.

If the value K of the left side of the Kraft's inequality is greater than one (No in step S307), the redundant leaf removing unit 356 increases the code length of the symbol s by one bit (step S308). That is, the redundant leaf removing unit 356 determines that the code lengths of the set of symbols S do not satisfy the Kraft's inequality due to decreasing the code length of the symbol s by one bit in step S305. Thus, the redundant leaf removing unit 356 restores the code length of the symbol s. Then, the redundant leaf removing unit 356 adds one to the variable i (step S309), and the process in the redundant leaf removing unit 356 proceeds to step S304. Thus, the redundant leaf removing unit 356 selects a subsequent symbol from the symbols acquired in step S302, and performs a process of decreasing the code length of the subsequent symbol.

When the value K is one or less (Yes in step S307), the redundant leaf removing unit 356 determines whether the value K is less than one (step S310).

When the value K is less than one (Yes in step S310), the process in the redundant leaf removing unit 356 proceeds to step S305. Accordingly, a process of further decreasing the code length of the symbol s is performed. That is, when the value K is less than one, the redundant leaf removing unit 356 determines that there is a redundant leaf node in the Huffman tree 50 and performs a process of further decreasing the code length of the symbol s. When the value K is not less than one (No in step S310), that is, when it is one, the redundant leaf removal unit 356 ends the redundant leaf removing process. In other words, when the value K is one, the redundant leaf removing unit 356 determines that there is no redundant leaf node in the Huffman tree 50, and ends the redundant leaf removing process.

With the redundant leaf removing process described above, the redundant leaf removing unit 356 can remove from the Huffman tree 50 a redundant leaf node generated by changing a code length, which is smaller than the upper limit, to the upper limit, in the upper limit violation correction process. More specifically, the redundant leaf removing unit 356 can repeat a process of reducing the code length of a symbol whose unconstrained code length is less than the upper limit bit by bit until the value K of the left side of the Kraft's inequality becomes one. Thus, the code length upper limit violation correction unit 323 can acquire the code length table 42 whose value K of the left side of the Kraft's inequality is one.

With reference to FIGS. 10 to 13, a description will be given of an operation in which the code length upper limit violation correction unit 323 constrains the code lengths of the set of symbols S to the upper limit, using an example of modification to the Huffman tree 50 shown in FIG. 6. The Huffman tree 50 shown in FIG. 6 is constructed by the code length determination unit 322 on the basis of the frequency of occurrence of each of symbols without considering the upper limit of code length. The code length upper limit violation correction unit 323 modifies the Huffman tree 50 of FIG. 6 to satisfy the constraints of the upper limit of code length and the Kraft's inequality. It is assumed here that the upper limit of code length is four. For the sake of clarity, it is assumed that the degree of parallelism M is one.

Figure 10:
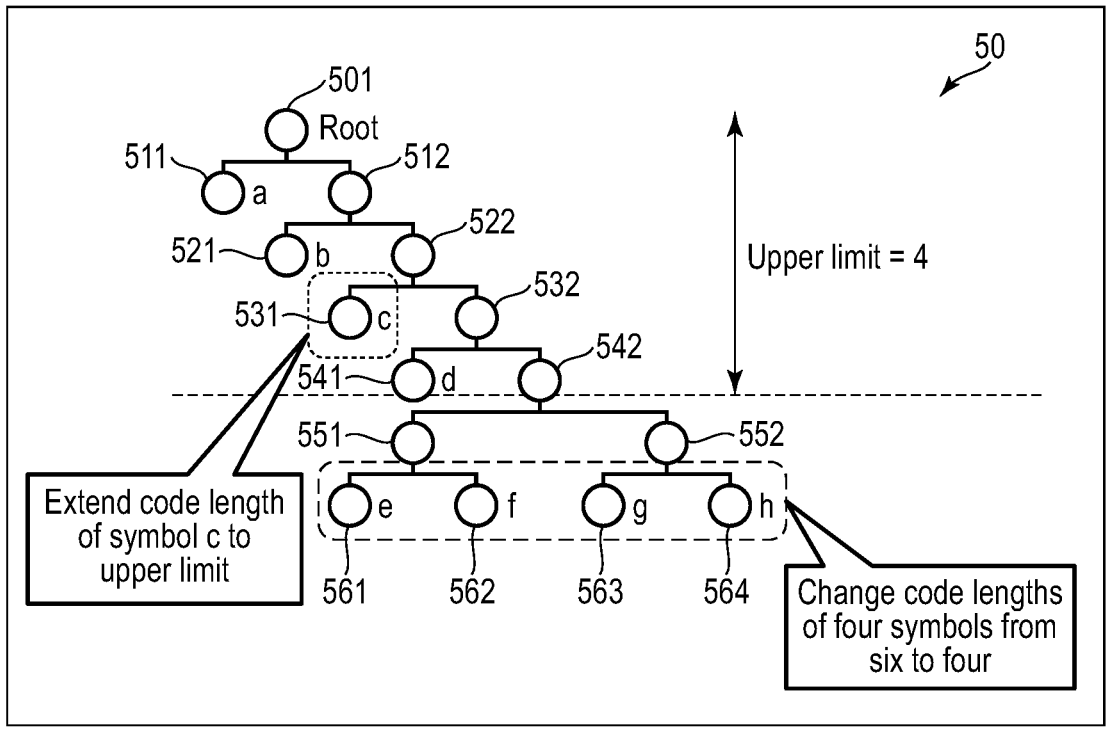
FIG. 10 is a diagram illustrating a modification to the Huffman tree of FIG. 6 in the compression device of the first embodiment.

FIG. 10 shows an example where the code length upper limit violation correction unit 323 determines symbols whose code lengths exceed the upper limit and a symbol whose code length is extended to the upper limit.

Specifically, the code length upper limit violation correction unit 323 determines the four symbols "e", "f", "g", and "h" (that is, the leaf nodes 561, 562, 563, and 564) whose code lengths exceed four.

The code length upper limit violation correction unit 323 changes the code lengths of the determined four symbols "e", "f", "g", and "h" from six bits to four bits.

The code length upper limit violation correction unit 323 determines the symbol "c" (that is, the leaf node 531) whose code length is longest from the symbols whose code lengths are less than four bits. The code length upper limit violation correction unit 323 changes the code length of the determined symbol "c" from three bits to four bits.

Figure 11:
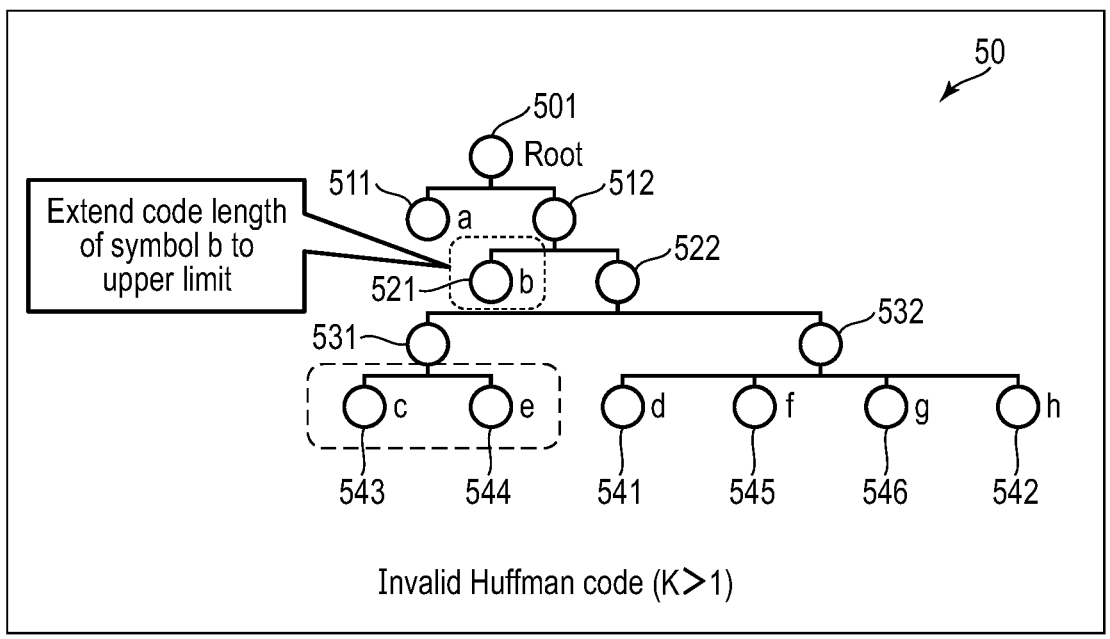
FIG. 11 is a diagram illustrating a modification to the Huffman tree of FIG. 10 in the compression device of the first embodiment.

FIG. 11 shows the Huffman tree 50 in which the code lengths of the four symbols "e", "f", "g", and "h" and the code length of the symbol "c" are changed according to the above-described change.

Since the code length of the symbol "c" is changed from three bits to four bits, the node 531 is changed from a leaf node to an intermediate node, and two leaf nodes 543 and 544 having the intermediate node 531 as a parent node are added to the Huffman tree 50. The symbol "c" is assigned to the leaf node 543. The symbol "e" is assigned to the leaf node 544.

Since, in the Huffman tree 50, the code lengths of the four symbols "e", "f", "g", and "h" are changed from six bits to four bits, four leaf nodes 541, 545, 546, and 542 having the intermediate node 532 as a parent node are generated. The Huffman tree 50 is thus invalid. Therefore, the Huffman code determined based on the Huffman tree 50 is an invalid Huffman code which does not satisfy the Kraft's inequality (i.e., K>1).

The code length upper limit violation correction unit 323 further determines a leaf node whose code length is to be increased to the upper limit. Specifically, the code length upper limit violation correction unit 323 determines the symbol "b" (that is, the leaf node 521) whose code length is longest from symbols whose code lengths are less than four. The code length upper limit violation correction unit 323 changes the code length of the determined symbol "b" from two bits to four bits.

Figure 12:
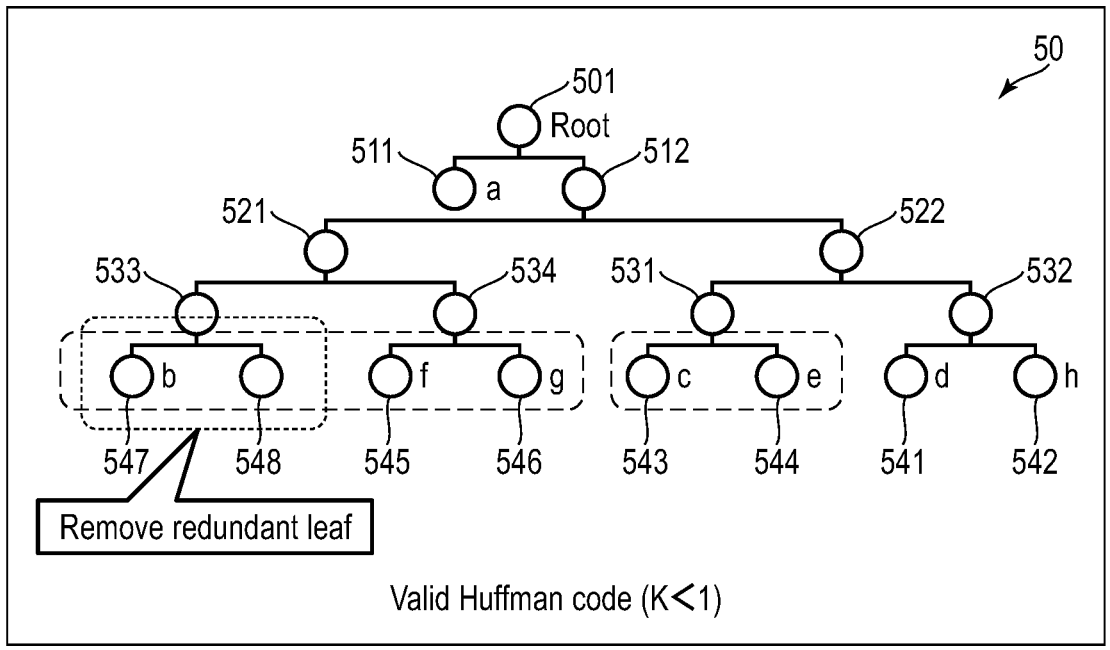
FIG. 12 is a diagram illustrating a modification to the Huffman tree of FIG. 11 in the compression device of the first embodiment.

FIG. 12 shows the Huffman tree 50 in which the code length of the symbol "b" has been changed.

Since the code length of the symbol "b" is changed from two bits to four bits, the node 521 is changed from a leaf node to an intermediate node, and two intermediate nodes 533 and 534 having the intermediate node 531 as a parent node, two leaf nodes 547 and 548 having the intermediate node 533 as a parent node, and two leaf nodes 545 and 546 having the intermediate node 534 as a parent node are added to the Huffman tree 50. The Huffman tree 50 is valid. Thus, the Huffman code determined based on the Huffman tree 50 is a valid Huffman code satisfying the Kraft's inequality (that is, K<1).

The code length upper limit violation correction unit 323 further removes the redundant leaf node 548 to which no symbol is assigned.

Figure 13:
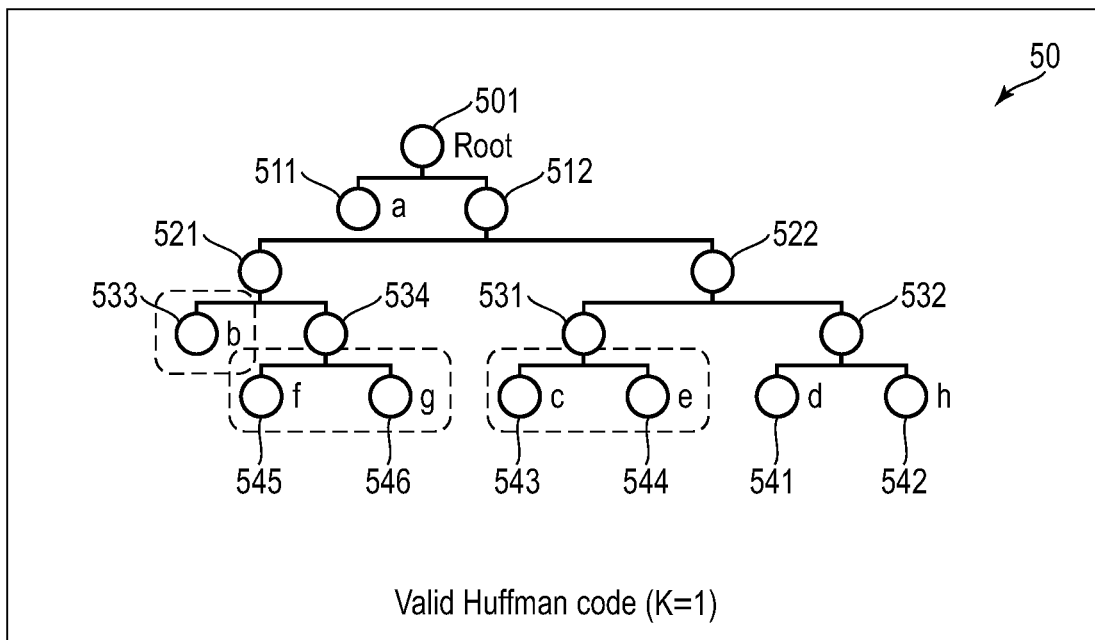
FIG. 13 is a diagram illustrating a modification of the Huffman tree of FIG. 12 in the compression device of the first embodiment.

FIG. 13 shows the Huffman tree 50 from which the redundant leaf node 548 has been removed.

A binary tree including the redundant leaf node 548, the leaf node 547 and the intermediate node 533 is merged to form a leaf node 533. The symbol "b" assigned to the leaf node 547, is assigned to the leaf node 533. That is, the code length of the symbol "b" is reduced by one bit from four bits to three bits.

The Huffman tree 50 is valid. Therefore, the Huffman code determined based on the Huffman tree 50 satisfies the Kraft's inequality and becomes a valid Huffman code in which no redundant code is assigned (that is, K=1).

With reference to FIGS. 14 to 17, an operation in which the code length upper limit violation correction unit 323 constrains code lengths to the upper limit will be described, using an example of changing the code length table 42. The code length table 42 shown in FIGS. 14 to 17 manages not only the unconstrained code lengths determined by the code length determination unit 322 but also the code lengths determined (corrected) by the code length upper limit violation correction unit 323. Hereinafter, the code length determined by the code length upper limit violation correction unit 323 may be referred to as a constrained code length. The constrained code length is a code length determined on the basis of the frequency of occurrence of each of the symbols and the constraint of the upper limit of code length.

FIG. 14 shows an example of modifying the code length table 42 by the code length upper limit violation correction unit 323. Each of entries in the code length table 42 includes a symbol field, an unconstrained code length field and a constrained code length field.

The symbol field indicates a corresponding symbol. The unconstrained code length field indicates an unconstrained code length (that is, a code length determined by the code length determination unit 322) of the corresponding symbol. The constrained code length field indicates a constrained code length of the corresponding symbol. The constrained code length is either the unconstrained code length of the corresponding symbol or a code length changed from the unconstrained code length by the code length upper limit violation correction unit 323.

In the example shown in FIG. 14, the values set in the symbol fields are the same as those set in the symbol fields of the code length table 42 shown in FIG. 7. In the example shown in FIG. 14, the values set in the unconstrained code length fields are the same as those set in the code length fields of the code length table 42 shown in FIG. 7.

The code length upper limit violation correction unit 323 sets, for example, the unconstrained code length of a symbol as an initial value of the corresponding constrained code length field. When the code length indicated in the constrained code length field exceeds the upper limit, the code length upper limit violation correction unit 323 changes the code length to the upper limit.

In the example shown in FIG. 14, the upper limit is four bits. In this case, the code length upper limit violation correction unit 323 specifies four symbols "e", "f", "g", and "h" whose unconstrained code lengths exceed the upper limit. The code length upper limit violation correction unit 323 changes the constrained code length of each of the specified four symbols from six bits to four bits. Note that the constrained code length of each of four symbols "a", "b", "c", and "d" whose unconstrained code lengths do not exceed the upper limit, coincides with the unconstrained code length.

The constrained code lengths of the set of symbols S shown in the code length table 42 do not satisfy the Kraft's inequality. The set of symbols S is a set of eight symbols "a", "b", "c", "d", "e", "f", "g", and "h" shown in the code length table 42. The constrained code lengths of the set of symbols S are eight constrained code lengths that are associated with the eight symbols "a", "b", "c", "d", "e", "f", "g", and "h", respectively, shown in the code length table 42. Thus, the eight constrained code lengths associated with their respective eight symbols "a", "b", "c", "d", "e", "f", "g", and "h" shown in the code length table 42 do not satisfy the Kraft's inequality (that is, K>1). The code length upper limit violation correction unit 323 thus selects a symbol whose constrained code length is to be increased from symbols whose constrained code lengths are less than the upper limit.

FIG. 15 shows an example in which the code length upper limit violation correction unit 323 selects a symbol whose constrained code length is to be increased from symbols whose constrained code lengths are less than the upper limit, and changes the constrained code length of the selected symbol to the upper limit.

The code length upper limit violation correction unit 323 selects M symbols in order from those having a longer constrained code length from symbols whose constrained code lengths are less than the upper limit. In order to make the description easier to understand, a case where M is set to one will be explained. The code length upper limit violation correction unit 323 therefore selects the symbol "c" whose constrained code length is longest from the symbols whose constrained code lengths are less than four bits.

The code length upper limit violation correction unit 323 changes the constrained code length of the selected symbol "c" from three bits to four bits. The code length upper limit violation correction unit 323 calculates a value K of the left side of the Kraft's inequality using the constrained code lengths of the set of symbols S. Since the value K of the left side of the Kraft's inequality is larger than one, the code length upper limit violation correction unit 323 determines that the constrained code lengths of the set of symbols S do not satisfy the Kraft's inequality. Thus, the code length upper limit violation correction unit 323 further selects M symbols in order having a longer constrained code length from the symbols whose constrained code lengths are less than the upper limit, and changes the constrained code length of each of the selected symbols to the upper limit.

FIG. 16 shows an example in which the code length upper limit violation correction unit 323 further selects a symbol whose constrained code length is to be increased from the symbols whose constrained code lengths are less than the upper limit, and changes the constrained code length of the selected symbol to the upper limit.

Specifically, the code length upper limit violation correction unit 323 selects the symbol "b" having the longest constrained code length among the symbols whose constrained code lengths are less than four. The code length upper limit violation correction unit 323 changes the constrained code length of the selected symbol "b" from two bits to four bits. Then, the code length upper limit violation correction unit 323 calculates the value K of the left side of the Kraft's inequality using the constrained code lengths of the set of symbols S. Since the value K of the left side of the Kraft's inequality is one or less, the code length upper limit violation correction unit 323 determines that the constrained code lengths of the set of symbols S satisfy the Kraft's inequality.

Then, the code length upper limit violation correction unit 323 performs an operation of reducing the constrained code length that is increased redundantly.

FIG. 17 shows an example in which the code length upper limit violation correction unit 323 reduces the constrained code length that is increased redundantly.

The code length upper limit violation correction unit 323 selects symbols one by one in the ascending unconstrained code length order from the symbols whose unconstrained code lengths are less than the upper limit and whose constrained code lengths are changed to the upper limit. Specifically, the code length upper limit violation correction unit 323 first selects the symbol "b" having the shortest unconstrained code length from the two symbols "b" and "c" whose unconstrained code lengths are less than the upper limit and whose constrained code lengths are changed to the upper limit. The code length upper limit violation correction unit 323 decreases the constrained code length of the selected symbol "b" by one bit, thereby changing it from four bits to three bits.

Then, the code length upper limit violation correction unit 323 calculates the value K of the left side of the Kraft's inequality using the constrained code lengths of the set of symbols S. Since the calculated value K of the left side of the Kraft's inequality is one, the code length upper limit violation correction unit 323 ends the change of the constrained code lengths.

If the calculated value K of the left side of the Kraft's inequality is greater than one, the code length upper limit violation correction unit 323 restores the constrained code length of the symbol "b", and decreases the constrained code length of another symbol (e.g., the symbol "c") by one bit. More specifically, the code length upper limit violation correction unit 323 increases the constrained code length of the symbol "b" by one bit, thereby returning it from three bits to four bits. Then, the code length upper limit violation correction unit 323 decreases the constrained code length of another symbol (e.g., the symbol "c") whose unconstrained code length is less than the upper limit and whose constrained code length is changed to the upper limit, by one bit. Then, the code length upper limit violation correction unit 323 calculates the value K of the left side of the Kraft's inequality again using the constrained code lengths of the set of symbols S. When the calculated value K of the left side of the Kraft's inequality is one, the code length upper limit violation correction unit 323 ends the change of the constrained code lengths.

If the calculated value K of the left side of the Kraft's inequality is less than one, the code length upper limit violation correction unit 323 further decreases the constrained code length of the symbol "b" by one bit. Then, the code length upper limit violation correction unit 323 calculates the value K of the left side of the Kraft's inequality again using the constrained code lengths of the set of symbols S. When the calculated value K of the left side of the Kraft's inequality is one, the code length upper limit violation correction unit 323 ends the change of the constrained code lengths.

As described above, the code length upper limit violation correction unit 323 repeats the operation of decreasing the constrained code length of one of the symbols whose unconstrained code lengths are less than the upper limit and whose constrained code lengths are changed to the upper limit by one bit in ascending unconstrained code length order, and determining whether the value K of the left side of the Kraft's inequality becomes one. When the constrained code length of one symbol is reduced by one bit and the value K of the left side of the Kraft's inequality is smaller than one, the code length upper limit violation correction unit 323 further decreases the constrained code length of the symbol by one bit.

When the value K of the left side of the Kraft's inequality is one, the Huffman code determined based on the constrained code lengths of the set of symbols S satisfies the Kraft's inequality and becomes a valid Huffman code in which no redundant code is assigned. That is, the constrained code lengths of the set of symbols S shown in FIG. 17 corresponds to the Huffman tree 50 of FIG. 13 which satisfies the Kraft's inequality and has no redundant leaf nodes.

The code length upper limit violation correction unit 323 (more specifically, the redundant leaf removing unit 356) sends the code length table 42 to the canonical Huffman processing unit 324. Specifically, the code length upper limit violation correction unit 323 sends the symbols shown in the code length table 42 and the constrained code lengths that are associated with the symbols, respectively, to the canonical Huffman processing unit 324.

In addition, the code length upper limit violation correction unit 323 sends the constrained code lengths to the pack processing unit 22 in the specific symbol order. The specific symbol order is, for example, an order conforming to the corresponding symbols in alphabetical order. That is, the code length upper limit violation correction unit 323 sends, in accordance with the symbols in alphabetical order, the corresponding constrained code lengths sequentially to the pack processing unit 22.

The canonical Huffman processing unit 324 generates a coding table 43 with the canonical Huffman coding using the code length table 42 sent by the code length upper limit violation correction unit 323. The coding table 43 may include a code length corrected by the code length upper limit violation correction unit 323. The canonical Huffman coding is capable of determining a code bit string (variable length code) to be assigned to each of the symbols, using only code lengths of the symbols. In the canonical Huffman coding, a code bit string is assigned to each symbol according to the following rules (1) and (2).

(1) A code bit string to be assigned to a symbol whose code length is short precedes in dictionary order a code bit string to be assigned to a symbol whose code length is long.

(2) In two symbols whose code lengths are equal, a code bit string assigned to one of the two symbols preceding in symbol order precedes in dictionary order a code bit string assigned to the other of the two symbols succeeding in symbol order.

For example, in order to determine the dictionary order of code bit strings, the dictionary order of bit values "0" and "1" is defined as the order of "0" and "1". In this case, each bit value included in a code bit string and each bit value included in another code bit string are compared in order from the higher bit to determine the order (bit order) of the corresponding bit values, thereby determining the dictionary order of the code bit strings.

More specifically, for example, "1'b0", "2'b10", "3'b110", and "3'b111" are four code bit strings arranged in dictionary order. Note that a data string including at least one bit value of 0 or 1 following "X'b" indicates a bit data string of X bits. In these four code bit strings, therefore, the 1-bit code bit string "1'b0" precedes the 2-bit code bit string "2'b10" in the bit order of the most significant bit. The 2-bit code bit string "2'b10" precedes the 3-bit code bit string "3'b110" in the bit order of the next most significant bit. The 3-bit code bit string "3'b110" precedes the 3-bit code bit string "3'b111" in the bit order of the least significant bit.

FIG. 18 shows an example of a pseudo-program for assigning a code bit string to a symbol by the canonical Huffman processing unit 324. In the pseudo-program, a variable code is used for calculating a code bit string assigned to a symbol.

First, the canonical Huffman processing unit 324 sets the variable code to 0 (=1'b0). When code bit strings are to be assigned to symbols, respectively, the number of bits of the variable code depends upon the minimum one of code lengths that are associated with the symbols.

Next, in one while loop, the canonical Huffman processing unit 324 determines a code bit string to be assigned to one symbol in ascending code length order and in specific symbol order in the case of the same code length.

For example, in the first while loop, the canonical Huffman processing unit 324 selects, as an object to which a code bit string is assigned, a symbol whose code length is shortest and which precedes in specific symbol order another symbol with the same code length if any. Then, the canonical Huffman processing unit 324 assigns the variable code (=1'b0) as a code bit string of the selected symbol. As described above, the number of bits of the variable code assigned first depends upon the minimum code length. It is assumed in this example that the minimum code length is one. Then, the canonical Huffman processing unit 324 performs a shift operation of shifting a value, which is obtained by adding one to the variable code, to the left by the number of bits obtained by subtracting the code length of the current symbol from the code length of the next symbol, and sets the value obtained by the shift operation as the variable code. For example, when the number of bits obtained by subtracting the code length of the current symbol from the code length of the next symbol is one, 2'b10 obtained by shifting 1'b1, which is a value obtained by adding one to the variable code (=1'b0), to the left by one bit, is set as the variable code.

For example, in the second while loop, the canonical Huffman processing unit 324 selects, as an object to which a code bit string is assigned, a symbol whose code length is second shortest or a symbol whose code length is shortest and which is the second in specific symbol order when there is another symbol with the same code length. The canonical Huffman processing unit 324 assigns the variable code (=2'b10) as a code bit string of the selected symbol. Then, the canonical Huffman processing unit 324 performs a shift operation of shifting a value, which is obtained by adding one to the variable code, to the left by the number of bits obtained by subtracting the code length of the current symbol from the code length of the next symbol, and sets the value obtained by the shift operation as the variable code. For example, when the number of bits obtained by subtracting the code length of the current symbol from the code length of the next symbol is one, 3'b110 obtained by shifting 2'b11, which is a value obtained by adding one to the variable code (=2'b10), to the left by one bit, is set as the variable code.

The foregoing loop process allows the canonical Huffman processing unit 324 to assign a code bit string to each of symbols using the relationship in order among the symbols and code lengths that correspond to the symbols, respectively. That is, the canonical Huffman processing unit 324 can uniquely determine a code bit string to be assigned to each of the symbols by determining the relationship in order among the symbols and the code length of each of the symbols.

This indicates that the decompression device 16 can restore a decoding table by encoding code lengths arranged in predetermined symbol order as a header in the compressed data output by the pack processing unit 22. Since the code lengths arranged in the symbol order are encoded, the code amount overhead of the compressed data can significantly be reduced as compared with the case of encoding code bit strings themselves.

Therefore, as described above, the code length upper limit violation correction unit 323 (more specifically, the redundant leaf removing unit 356) sends, to the pack processing unit 22, code lengths (constrained code lengths) indicated in the corrected code length table 42 according to the corresponding symbols in symbol order. The pack processing unit 22 adds the code lengths arranged according to the corresponding symbols in symbol order, to the head of the compressed data as a header.

FIG. 19 shows an example of assigning a code bit string to a symbol by the canonical Huffman processing unit 324. Here is an example in which the canonical Huffman processing unit 324, which executes the pseudo program shown in FIG. 18, assigns a code bit string to each of four symbols "B", "A", "C", and "D" shown in FIG. 19 using code lengths.

The four symbols "B", "A", "C", and "D" are sorted in ascending code length order. When the four symbols include multiple symbols having the same code length, the multiple symbols are sorted in specific symbol order (alphabetic order here). Specifically, the code length of the symbol "B" is one, which is the shortest. The code length of the symbol "A" is two, which is the second shortest. The code length of each of the symbols "C" and "D" is three, which is the third shortest. The symbol "C" precedes the symbol "D" in alphabetical order.

First, the canonical Huffman processing unit 324 sets the variable code to 0 (=1'b0).

Then, in the first while loop, the canonical Huffman processing unit 324 selects the symbol "B" having the shortest code length as an object to which a code bit string is assigned. The canonical Huffman processing unit 324 assigns the variable code (=1'b0) as a code bit string of the selected symbol "B". The number of bits of the variable code assigned first depends upon the minimum code length among the code lengths of the four symbols "B", "A", "C", and "D" (that is, the code length of the symbol "B"). The number of bits of the variable code is thus one. Then, the canonical Huffman processing unit 324 performs a shift operation of shifting the value, which is obtained by adding one to the variable code, to the left by one bit (=2−1) obtained by subtracting the code length of the current symbol "B" from the code length of the next symbol "A" and sets the value of 2'b10 obtained by the shift operation as the variable code.

In the second while loop, the canonical Huffman processing unit 324 selects the symbol "A" having the second shortest code length as an object to which a code bit string is assigned. The canonical Huffman processing unit 324 assigns the variable code (=2'b10) as a code bit string of the selected symbol "A". Then, the canonical Huffman processing unit 324 performs a shift operation of shifting a value, which is obtained by adding one to the variable code, to the left by one bit (=3−2) obtained by subtracting the code length of the current symbol "A" from the code length of the next symbol "C" and sets the value of 3'b110 obtained by the shift operation as the variable code.

In the third while loop, the canonical Huffman processing unit 324 selects, as an object to which a code bit string is assigned, the symbol "C" whose code length is the third shortest and which precedes the symbol "D", which has the same code length, in specific symbol order. The canonical Huffman processing unit 324 assigns the variable code (=3'b110) as a code bit string of the selected symbol "C". Then, the canonical Huffman processing unit 324 performs a shift operation of shifting a value, which is obtained by adding one to the variable code, to the left by zero bit (=3−3) obtained by subtracting the code length of the current symbol "C" from the code length of the next symbol "D", and sets the value of 3'b111 obtained by the shift operation as the variable code. That is, when the code lengths of the two symbols "C" and "D" are the same, the canonical Huffman processing unit 324 sets a value that is obtained by adding one to the variable code, as a new value of the variable code.

In the fourth while loop, the canonical Huffman processing unit 324 selects, as an object to which a code bit string is assigned, the symbol "D" whose code length is the third shortest and which follows the symbol "C", which has the same code length, in the specific symbol order. The canonical Huffman processing unit 324 assigns the variable code (=3'b111) as a code bit string of the selected symbol "D".

Thus, the canonical Huffman processing unit 324 can uniquely determine a code bit string assigned to each of the symbols on the basis of the code length of each of the symbols and the specific symbol order when there are symbols having the same code length. The canonical Huffman processing unit 324 sends, to the coding unit 33, the coding table 43 that indicates the symbols and the code bit strings that are assigned to the symbols, respectively.

Accordingly, the coding unit 33 can convert a symbol sent by the delay buffer 31 into a code bit string (variable length code) by using the coding table 43.

With the foregoing configuration, the dynamic Huffman encoder 21 can reduce degradation of compression performance when the code lengths are limited to the upper limit or less.

The fact that the dynamic Huffman encoder 21 according to the present embodiment can reduce degradation of compression performance when the code lengths are limited to the upper limit value or less will be described using a dynamic Huffman encoder provided in a compression device according to a comparative example.

Figure 20:
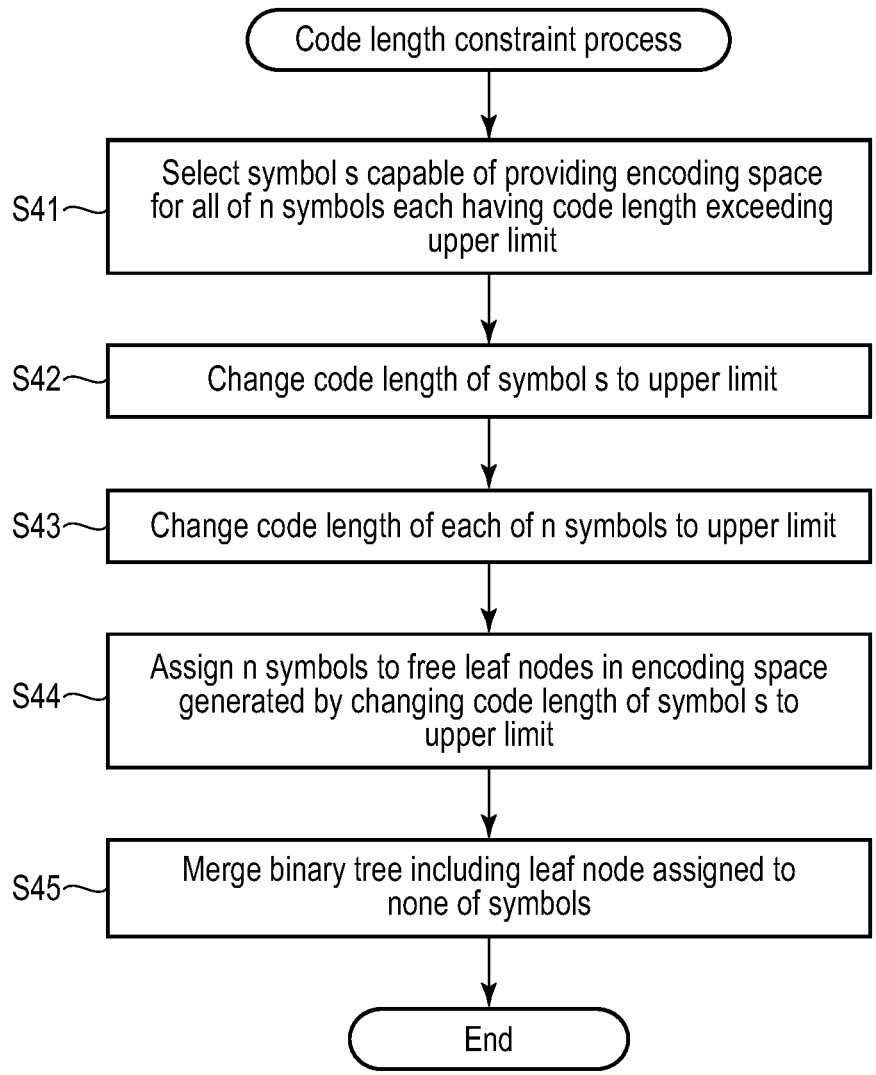
FIG. 20 is a flowchart illustrating an example of the procedure of a code length constraint process performed in a compression device according to a comparative example.

FIG. 20 is a flowchart showing an example of the procedure of a code length constraint process performed by the dynamic Huffman encoder of the comparative example. The dynamic Huffman encoder performs the code length constraint process after performing the code length determination process described above with reference to FIG. 4, for example. Here is an example of a case where the dynamic Huffman encoder uses the code length table 42 generated by the code length determination unit 322. The code length table 42 includes information indicating symbols and code lengths that are associated with the symbols, respectively. The code lengths are determined without considering the upper limit of code length.

First, the dynamic Huffman encoder of the comparative example selects, from the symbols indicated in the code length table 42, a symbol s capable of providing an encoding space for all of n symbols each having a code length exceeding the upper limit (step S41). The fact that an encoding space can be provided for all of n symbols means that leaf nodes each corresponding to a code length that is equal to or less than the upper limit can be assigned to all of the n symbols, respectively, in the Huffman tree corresponding to the code length table 42.

Then, the dynamic Huffman encoder changes the code length of the symbol s to the upper limit (step S42). The dynamic Huffman encoder changes the code length of each of the n symbols to the upper limit (step S43). The dynamic Huffman encoder assigns the n symbols to free leaf nodes in an encoding space generated by changing the code length of the symbol s to the upper limit (step S44). Then, the dynamic Huffman encoder merges a binary tree including a leaf node assigned to none of the symbols (step S45), and ends the code length constraint process.

The foregoing code length constraint process enables the dynamic Huffman encoder of the comparative example to change code lengths exceeding the upper limit associated with symbols to the upper limit. The dynamic Huffman encoder changes the code length of the symbol s capable of providing an encoding space for all of the n symbols each having a code length exceeding the upper limit to the upper limit, thereby changing the code length of each of the n symbols to the upper limit.

If, however, the code length of the symbol s is significantly changed, the compression performance of the dynamic Huffman encoder may significantly be decreased.

With reference to FIGS. 21 and 22, the decrease in compression performance will be described using an example in which the dynamic Huffman encoder of the comparative example modifies the Huffman tree 50 shown in FIG. 6. The Huffman tree 50 shown in FIG. 6 is constructed by the code length determination unit 322 on the basis of the frequency of occurrence of each of symbols without considering the upper limit of code length. It is assumed here that the upper limit of code length is four.

FIG. 21 shows an example in which the dynamic Huffman encoder of the comparative example determines symbols each having a code length exceeding the upper limit, and a symbol capable of providing an encoding space for all of the symbols each having a code length exceeding the upper limit.

Specifically, the dynamic Huffman encoder determines four symbols "e", "f", "g", and "h" (that is, leaf nodes 661, 662, 663, and 664) each having a code length exceeding four in the Huffman tree 60. The dynamic Huffman encoder changes the code length of each of the determined four symbols "e", "f", "g", and "h" from six bits to four bits. The dynamic Huffman encoder changes parent nodes connected to the leaf nodes 661, 662, 663, and 664 corresponding to the four symbols "e", "f", "g", and "h" in the Huffman tree 60 to change the code lengths (that is, the depths of the leaf nodes) to four bits.

When changing the code lengths of the four symbols "e", "f", "g", and "h" from six bits to four bits, the dynamic Huffman encoder selects a leaf node L whose code length is sufficiently short (a leaf node 611 in the example shown in FIG. 21). Then, the dynamic Huffman encoder constructs a subtree that includes five leaf nodes to which a symbol "a" corresponding to the selected leaf node L and the four symbols "e", "f", "g", and "h" each having a code length exceeding four are assigned and has the node L as a parent node. The leaf node L whose code length is sufficiently short indicates a leaf node that provides the code lengths of all symbols becoming equal to or less than the upper limit when the subtree is constructed. The dynamic Huffman encoder selects a leaf node having the longest code length as the leaf node L from leaf nodes satisfying the following expression (2).

2(code length upper limit−code length of leaf node L)≥1+number of symbols which violate constraint of upper limit of code length    Expression (2)

The left side of the expression (2) represents the maximum number of leaf nodes of a subtree which has the leaf node L as a parent node and whose depth from a root node 601 is equal to or less than the upper limit. That is, the left side of the expression (2) represents the maximum number of symbols that can be accepted by the subtree when the subtree which has the leaf node L as a parent node and in which all the leaf nodes satisfy the constraint of the upper limit of code length is constructed.

The right side of the expression (2) represents the sum of the number of a symbol corresponding to the leaf node L (that is, one) and the number of symbols which violate the constraint of the upper limit of code length and whose code lengths need to be changed. By performing a Huffman tree modification process for the leaf node satisfying the expression (2), in the subtree having the leaf node L as a parent node, a leaf node can be assigned to a symbol corresponding to the leaf node L and leaf nodes can be assigned to symbols each violating the constraint of the upper limit of code length.

In the example shown in FIG. 21, the dynamic Huffman encoder determines the symbol "a" (that is, the leaf node 611) which can provide an encoding space for all of the four symbols "e", "f", "g", and "h". The code length of the symbol "a" is one bit. By changing the code length of the symbol "a" from one bit to four bits, seven leaf nodes are added to the Huffman tree 60. More specifically, by changing the code length of the symbol "a" from one bit to four bits, the Huffman tree 60 is provided with a subtree having eight ($=2^{(4-1)}$) leaf nodes 643, 644, 654, 646, 647, 648, 649, and 640 each having a code length (depth) of four bits. The symbol "a" is assigned to the leaf node 647 of the eight leaf nodes 643, 644, 654, 646, 647, 648, 649, and 640. Thus, seven leaf nodes are added to the Huffman tree 60 by changing the code length of the symbol "a" from one bit to four bits.

The number of leaf nodes to be added (=7) is equal to or larger than the number of symbols whose code lengths exceed four (=4). It can thus be said that the symbol "a" can provide an encoding space for all of the four symbols "e", "f", "g", and "h". That is, the leaf node 611 corresponding to the symbol "a" satisfies the expression (2) ($2^{4-1}=8\geq1+4$).

The leaf node 621 corresponding to the symbol "b" having the next longest code length does not satisfy the expression (2) ($2^{4-2}=4<1+4$). Therefore, the dynamic Huffman encoder determines the symbol "a" that can provide an encoding space for all of the four symbols "e", "f", "g", and "h".

The dynamic Huffman encoder assigns the four symbols "e", "f", "g", and "h" to, for example, the added leaf nodes 647, 648, 649, and 640, respectively.

In addition, the dynamic Huffman encoder may remove three redundant leaf nodes 643, 644, and 645 to which no symbols are assigned. The dynamic Huffman encoder sequentially merges binary trees having redundant leaf nodes 643, 644, and 645, thereby removing the redundant leaf nodes. By removing three leaf nodes 643, 644, and 645, an intermediate node 623 becomes a leaf node 623 to which the symbol "a" is assigned. That is, the code length of the symbol "a" is two bits.

FIG. 22 shows a Huffman tree 60 from which redundant leaf nodes are removed after the code lengths of the four symbols "e", "f", "g", and "h" and the code length of the symbol "a" are changed.

In the Huffman tree 60 shown in FIG. 22, the code lengths of the four symbols "e", "f", "g", and "h" are four bits. The code length of the symbol "a" is two bits. Accordingly, the Huffman tree 60 in which the code lengths of all the symbols are equal to or less than the upper limit (four bits) is constructed.

In the modification to the Huffman tree 60 shown in FIGS. 21 and 22, the dynamic Huffman encoder increases the code length of the symbol "a" whose original code length is the shortest. The shorter the associated code length of a symbol, the higher the frequency of occurrence of the symbol. Thus, the frequency of occurrence of the variable length code corresponding to the symbol in the compressed data also increases. Therefore, the shorter the associated original code length (unconstrained code length) of a symbol, the greater the influence of increase in the code length on the compression performance.

The dynamic Huffman encoder of the comparative example increases the shortest code length associated with the symbol "a" two times, as shown in the Huffman tree 60 in FIGS. 21 and 22. This reduces the compression performance of the dynamic Huffman encoder greatly.

In contrast, the dynamic Huffman encoder 21 of the compression device 15 according to the first embodiment increases the code length in preference to a symbol associated with longer code length that is less than the upper limit. That is, the dynamic Huffman encoder 21 selects a symbol whose frequency of occurrence is lower as a symbol for increasing the code length with a high priority. Accordingly, the degradation of compression performance can be reduced even when the code lengths are limited to the upper limit or less.

The Huffman tree 50 of FIG. 13 modified by the dynamic Huffman encoder 21 of the first embodiment will be proved to be superior in compression performance to the Huffman tree 60 of FIG. 22 modified by the dynamic Huffman encoder of the comparative example. Here, the frequency of occurrence of a symbol x is represented as F(x). The total amount of codes in a case where the dynamic Huffman encoder of the comparative example encodes symbols on the basis of the Huffman tree 60 of FIG. 22 will be defined as CodeBit1. Furthermore, the total amount codes in a case where the dynamic Huffman encoder 21 of the first embodiment encodes the symbols on the basis of the Huffman tree 50 of FIG. 13 will be defined as CodeBit2.

CodeBit1 is calculated by the following equation (3):

$$CodeBit1 = 2 \times F(a) + 2 \times F(b) + 3 \times (F(c) + F(d)) + 4 \times (F(e) + F(f) + F(g) + F(h)) \quad \text{Equation (3)}$$

CodeBit2 is calculated by the following equation (4):

$$CodeBit2 = 1 \times F(a) + 3 \times F(b) + 4 \times (F(c) + F(d)) + 4 \times (F(e) + F(f) + F(g) + F(h)) \quad \text{Equation (4)}$$

The difference between CodeBit1 and CodeBit2 is calculated by the following equation (5):

$$CodeBit1 - CodeBit2 = F(a) - (F(b) + F(c) + F(d)) \quad \text{Equation (5)}$$

According to the Huffman tree 50 shown in FIG. 6 before the modification, the frequencies of occurrence of the symbols have the following three relationships.

$$F(c) \geq F(d) + F(e) + F(f) + F(g) + F(h)$$

$$F(b) \geq F(c) + F(d) + F(e) + F(f) + F(g) + F(h)$$

$$F(a) \geq F(b) + F(c) + F(d) + F(e) + F(f) + F(g) + F(h)$$

Therefore, the total amount of codes CodeBit2 by the dynamic Huffman encoder 21 of the first embodiment is smaller than the total amount of codes CodeBit1 by the dynamic Huffman encoder of the comparative example. Accordingly, the compression performance based on the Huffman tree 50 of FIG. 13 modified by the dynamic Huffman encoder 21 of the first embodiment is higher than the compression performance based on the Huffman tree 60 of FIG. 22 modified by the dynamic Huffman encoder of the comparative example. That is, the dynamic Huffman encoder 21 of the first embodiment can reduce degradation of compression performance, as compared with the dynamic Huffman encoder of the comparative example when the code lengths are limited to the upper limit or less.

Note that when the code lengths are limited to the upper limit or less, the dynamic Huffman encoder 21 of the first embodiment increases code lengths of one or more symbols, which are less than the upper limit, in descending order of code length. Thus, the dynamic Huffman encoder 21 of the first embodiment may increase the number of steps (that is, the number of process cycles) for increasing the code lengths of symbols, as compared with the dynamic Huffman encoder of the comparative example in which the code length of one symbol is increased.

To cope with the increase in the number of steps, the dynamic Huffman encoder 21 of the first embodiment increases code lengths of M symbols in parallel. The dynamic Huffman encoder 21 of the first embodiment can thus restrain the number of steps for increasing code lengths of symbols from increasing.

Therefore, the dynamic Huffman encoder 21 of the first embodiment can reduce degradation of compression performance while restraining the number of steps for increasing code lengths of symbols from increasing when the code lengths are limited to the upper limit value or less.

Second Embodiment

In a one-cycle process in the first embodiment, the code length upper limit violation correction unit 323 of the dynamic Huffman encoder 21 selects M symbols whose code lengths are less than the upper limit and changes the code lengths of the M symbols to the upper limit in parallel. In a one-cycle process in the second embodiment, the code length upper limit violation correction unit 323 selects M symbols whose code lengths are less than the upper limit and changes the code lengths of the M symbols to the upper limit in parallel. In another one-cycle process after the one-cycle process in the second embodiment, the code length upper limit violation correction unit 323 selects N symbols whose code lengths are less than the upper limit and changes the code lengths of the N symbols to the upper limit in parallel. N is an integer of M or less. The configuration of a compression device 15 according to the second embodiment is the same as that of the compression device 15 according to the first embodiment. The second embodiment differs from the first embodiment only in the procedures of a process performed by the code length upper limit violation correction unit 323. The difference of the second embodiment from the first embodiment will mainly be described below.

The procedure from step S23 to step S25 in the upper limit violation correction process shown in the flowchart of FIG. 8 is a loop process that is performed repeatedly while the value K of the left side of the Kraft's inequality is greater than one.

Specifically, as described above, the code length changing unit 353 selects M symbols whose code lengths are smaller than the upper limit in descending code length order in the code length table 42 (step S23). The code length changing unit 353 changes, in the code length table 42, the code lengths of the M symbols selected to the upper limit in parallel (step S24). Then, the Kraft's inequality left-side calculating unit 354 calculates the value K of the left side of the Kraft's inequality using the code lengths of set of symbols S that include the changed code lengths (step S25).

Performing the procedure from step S23 to step S25 once will be referred to as a one-cycle process.

The larger the number of times of performing the one-cycle process (that is, the number of cycles), the higher the possibility of generating a redundant leaf node in the Huffman tree 50 constructed. This is due to the following two reasons.

(1) The larger the number of cycles, the shorter the code length (unconstrained code length) of a symbol that is changed. Thus, the number of leaf nodes added by changing the code length to the upper limit increases.

(2) The larger the number of cycles, the closer to one or less the value K of the left side of the Kraft's inequality. Thus, of the leaf nodes added by changing the code length to the upper limit, redundant leaf nodes tend to increase in number.

Therefore, as the number of cycles increases, the code length upper limit violation correction unit 323 may decrease the number of symbols whose code lengths are changed in parallel in a one-cycle process (the degree of parallelism) M from a specific initial value. For example, the code length upper limit violation correction unit 323 sets four as the initial value of M and performs a two-cycle process. In addition, the code length upper limit violation correction unit 323 changes M from four to two, and performs a two-cycle process. Furthermore, the code length upper limit violation correction unit 323 changes M from two to one and performs the subsequent cycle process.

As described above, as the number of cycles increases, the code length upper limit violation correction unit 323 decreases the number of symbols whose code lengths are changed to the upper limit in a one-cycle process. That is, in a one-cycle process, the code length upper limit violation correction unit 323 selects M (e.g., four) symbols whose code lengths are less than the upper limit and changes the code lengths of the M symbols to the upper limit in parallel. Then, in another one-cycle process after the one-cycle process, the code length upper limit violation correction unit 323 selects N (e.g., two) symbols whose code lengths are less than the upper limit and changes the code lengths of the N symbols to the upper limit in parallel. M is, for example, an integer of two or more. N is an integer less than or equal to M.

Thus, the code length upper limit violation correction unit 323 can suppress the number of redundant leaf nodes that are generated in accordance with the change of the code lengths. Therefore, the code length upper limit violation correction unit 323 can reduce the amount of processing required for removing the redundant leaf nodes.

As described above, according to the first and second embodiments, the degradation of compression performance can be reduced when the code lengths are limited to not greater than the upper limit.

The coding table generation unit 32 determines a plurality of code lengths that are respectively associated with a plurality of symbols, based on the frequency of occurrence of each of the plurality of symbols. When the plurality of symbols include one or more first symbols that are respectively associated with one or more first code lengths that exceed the upper limit, the coding table generation unit 32 changes the one or more first code lengths to the upper limit, selects, from one or more second symbols of the plurality of symbols, which are respectively associated with one or more second code lengths less than the upper limit, at least one third symbol in descending associated code length order, changes at least one third code length associated with the at least one third symbol to the upper limit, and generates a coding table 43 that indicates the plurality of symbols and a plurality of variable-length codes respectively associated with the plurality of symbols, using at least the one or more first code lengths and the at least one third code length that are changed. The coding unit 33 converts a symbol into a variable-length code using the coding table 43. The code length of each of the plurality of variable-length codes is a bit length from one to the upper limit.

As described above, the coding table generation unit 32 selects, from one or more second symbols of the plurality of symbols that are respectively associated with one or more second code lengths shorter than the upper limit, at least one third symbol in descending associated code length order, and changes at least one third code length associated with at least one third symbol to the upper limit. Therefore, the degradation of compression performance can be reduced, as compared with, for example, the case of selecting one symbol capable of providing an encoding space for all symbols whose code lengths exceed the upper limit and changing the code length of the selected symbol to the upper limit.

Each of various functions described in the first and second embodiments may be realized by a circuit (e.g., a processing circuit). An exemplary processing circuit may be a programmed processor such as a central processing unit (CPU). The processor executes computer programs (instructions) stored in a memory thereby performs the described functions. The processor may be a microprocessor including an electric circuit. An exemplary processing circuit may be a digital signal processor (DSP), an application specific integrated circuit (ASIC), a microcontroller, a controller, or other electric circuit components. The components other than the CPU described according to the embodiments may be realized in a processing circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A compression device comprising:
a coding information generation unit configured to:
determine a plurality of code lengths that are respectively associated with a plurality of symbols, based on a frequency of occurrence of each of the plurality of symbols; and
when the plurality of symbols include one or more first symbols that are respectively associated with one or more first code lengths exceeding an upper limit, change the one or more first code lengths to the upper limit, select, from one or more second symbols of the plurality of symbols that are respectively associated with one or more second code lengths shorter than the upper limit, at least one third symbol in descending associated code length order, change at least one third code length associated with the at least one third symbol to the upper limit, and generate coding information that indicates the plurality of symbols and a plurality of variable-length codes that are respectively associated with the plurality of symbols, using at least the one or more first code lengths and the at least one third code length that are changed; and
a coding unit configured to convert a symbol of the plurality of symbols into a variable-length code of the plurality of variable-length codes using the coding information,
wherein a code length of each of the plurality of variable-length codes is a bit length from one to the upper limit.

2. The compression device of claim 1, wherein
the coding information generation unit is configured to calculate, after changing the at least one third code length to the upper limit, a left side value of a Kraft's inequality indicated below:

$$\Sigma_{s \in S} 2^{-l(s)} \le 1$$

where S represents the plurality of symbols, s represents a symbol belonging to the plurality of symbols, and l(s) represents a code length associated with a symbol s, and
when the left side value of the Kraft's inequality is larger than one, the coding information generation unit repeats a process until the left side value of the Kraft's inequality is equal to or smaller than one, wherein the process includes selecting at least one fourth symbol, which is not selected yet, in descending associated code length order from the one or more second symbols, and changing at least one fourth code length associated with the at least one fourth symbol to the upper limit.

3. The compression device of claim 2, wherein
the at least one third symbol is M symbols,
M is an integer of two or more, and
the coding information generation unit is configured to:
change, in parallel, M code lengths that are respectively associated with the M symbols to the upper limit; and
calculate the left side value of the Kraft's inequality.

4. The compression device of claim 3, wherein
the at least one fourth symbol is N symbols,
N is an integer that is equal to or less than M, and
the coding information generation unit is configured to:
  change, in parallel, N code lengths that are respectively associated with the N symbols to the upper limit; and
  calculate the left side value of the Kraft's inequality.

5. A control method of a compression device, comprising:
determining a plurality of code lengths that are respectively associated with a plurality of symbols, based on a frequency of occurrence of each of the plurality of symbols;
when the plurality of symbols include one or more first symbols that are respectively associated with one or more first code lengths exceeding an upper limit, changing the one or more first code lengths to the upper limit, selecting, from one or more second symbols of the plurality of symbols that are respectively associated with one or more second code lengths shorter than the upper limit, at least one third symbol in descending associated code length order, changing at least one third code length associated with the at least one third symbol to the upper limit, and generating coding information that indicates the plurality of symbols and a plurality of variable-length codes that are respectively associated with the plurality of symbols, using at least the one or more first code lengths and the at least one third code length that are changed; and
converting a symbol of the plurality of symbols into a variable-length code of the plurality of variable-length codes using the coding information,
wherein a code length of each of the variable-length codes is a bit length from one to the upper limit.

6. The control method of claim 5, wherein
after changing the at least one third code length to the upper limit, calculating a left side value of a Kraft's inequality indicated below:

$$\Sigma_{s \in S} 2^{-l(s)} \leq 1$$

where S represents the plurality of symbols, s represents a symbol belonging to the plurality of symbols, and l(s) represents a code length associated with a symbol s, and
  when the left side value of the Kraft's inequality is larger than one, repeating a process until the left side value of the Kraft's inequality is equal to or smaller than one, wherein the process includes selecting at least one fourth symbol, which is not selected yet, in descending associated code length order from the one or more second symbols, and changing at least one fourth code length associated with the at least one fourth symbol to the upper limit.

7. The control method of claim 6, wherein
the at least one third symbol is M symbols,
M is an integer of two or more, and
the control method further comprises:
  changing, in parallel, M code lengths that are respectively associated with the M symbols to the upper limit; and
  calculating the left side value of the Kraft's inequality.

8. The method of claim 7, wherein
the at least one fourth symbol is N symbols,
N is an integer that is equal to or less than M, and
the control method further comprises:
  changing, in parallel, N code lengths that are respectively associated with the N symbols to the upper limit; and
  calculating the left side value of the Kraft's inequality.

9. A memory system comprising:
a nonvolatile memory; and
a controller connected to the nonvolatile memory,
wherein the controller is configured to:
  determine a plurality of code lengths that are respectively associated with a plurality of symbols, based on a frequency of occurrence of each of the plurality of symbols;
  when the plurality of symbols include one or more first symbols that are respectively associated with one or more first code lengths exceeding an upper limit, change the one or more first code lengths to the upper limit, select, from one or more second symbols of the plurality of symbols that are respectively associated with one or more second code lengths shorter than the upper limit, at least one third symbol in descending associated code length order, change at least one third code length associated with the at least one third symbol to the upper limit, and generate coding information that indicates the plurality of symbols and a plurality of variable-length codes that are respectively associated with the plurality of symbols, using at least the one or more first code lengths and the at least one third code length that are changed;
  convert a symbol of the plurality of symbols into a variable-length code of the plurality of variable-length codes using the coding information; and
  write data based on the variable-length code, which is obtained by the conversion, into the nonvolatile memory,
wherein a code length of each of the plurality of variable-length codes is a bit length from one to the upper limit.

10. The memory system of claim 9, wherein
the controller is configured to calculate, after changing the at least one third code length to the upper limit, a left side value of a Kraft's inequality indicated below:

$$\Sigma_{s \in S} 2^{-l(s)} \leq 1$$

where S represents the plurality of symbols, s represents a symbol belonging to the plurality of symbols, and l(s) represents a code length associated with a symbol s, and
the controller is configured to repeat, when the left side value of the Kraft's inequality is larger than one, a process until the left side value of the Kraft's inequality is equal to or smaller than one, wherein the process includes selecting at least one fourth symbol, which is not selected yet, in descending associated code length order from the one or more second symbols, and changing at least one fourth code length associated with the at least one fourth symbol to the upper limit.

11. The memory system of claim 10, wherein
the at least one third symbol is M symbols,
M is an integer of two or more, and
the controller is configured to:
  change, in parallel, M code lengths that are respectively associated with the M symbols to the upper limit; and
  calculate the left side value of the Kraft's inequality.

12. The memory system of claim 11, wherein
the at least one fourth symbol is N symbols,
N is an integer that is equal to or less than M, and
the controller is configured to:
  change, in parallel, N code lengths that are respectively associated with the N symbols to the upper limit; and
  calculate the left side value of the Kraft's inequality.

* * * * *